(12) United States Patent
Tsubamoto et al.

(10) Patent No.: US 8,402,648 B2
(45) Date of Patent: Mar. 26, 2013

(54) PRINTED CIRCUIT BOARD FABRICATION METHOD

(75) Inventors: Daita Tsubamoto, Kawasaki (JP); Hitoshi Yokemura, Kawasaki (JP); Masaki Tosaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 583 days.

(21) Appl. No.: 12/364,036

(22) Filed: Feb. 2, 2009

(65) Prior Publication Data
US 2009/0294169 A1 Dec. 3, 2009

(30) Foreign Application Priority Data

May 29, 2008 (JP) .................................. 2008-140930

(51) Int. Cl.
*H01K 3/10* (2006.01)
(52) U.S. Cl. ................ 29/852; 29/825; 29/846; 174/260
(58) Field of Classification Search .................... 29/825, 29/846, 852; 174/260
See application file for complete search history.

(56) References Cited

U.S. PATENT DOCUMENTS

| | | | |
|---|---|---|---|
| 6,073,344 A * | 6/2000 | Japp et al. ....................... | 29/830 |
| 6,493,861 B1 * | 12/2002 | Li et al. ............................ | 716/137 |
| 6,820,331 B2 * | 11/2004 | Kishimoto et al. .............. | 29/852 |
| 7,404,251 B2 * | 7/2008 | Buchwalter et al. ............ | 29/852 |
| 7,935,895 B2 * | 5/2011 | Senk et al. ...................... | 174/262 |
| 2007/0246252 A1* | 10/2007 | Buchwalter et al. ........... | 174/260 |
| 2008/0073113 A1* | 3/2008 | Senk et al. ...................... | 174/262 |

FOREIGN PATENT DOCUMENTS

| | | | |
|---|---|---|---|
| JP | 6-315784 | | 11/1994 |
| JP | 06315784 A | * | 11/1994 |
| JP | 2005-26549 | | 1/2005 |
| JP | 2005026549 | * | 1/2005 |
| JP | 2005-235963 | | 9/2005 |
| JP | 2005-313191 | | 11/2005 |
| JP | 2005313191 | * | 11/2005 |

OTHER PUBLICATIONS

Machine translation of the Japanese document that Applicants have allready provided. This foreign document was already made "Of Recvord" by Applicants.*
Japanese Office Action mailed Jun. 12, 2012 issued in corresponding Japanese Patent Application No. 2008-140930.

* cited by examiner

*Primary Examiner* — Carl Arbes
(74) *Attorney, Agent, or Firm* — Staas & Halsey LLP

(57) ABSTRACT

A printed circuit board includes a through hole constituted by a hole penetrating through the front and rear surfaces of the printed circuit board. A fabrication method of the printed circuit board, includes applying conductive material plating to the inner wall surface of the hole to form a through hole electrically connecting the front and rear surfaces of the printed circuit board, and removing the conductive material plated on the hole inner wall surface at least at a portion between the front and rear surfaces of the printed circuit board is carried out to thereby fabricate a printed circuit board having a through hole electrically isolates the front surface of the printed circuit board from the rear surface thereof.

13 Claims, 31 Drawing Sheets

20C(THIRD LAYER) HIGH-SPEED FLAG HAS BEEN SET

20F(SIXTH LAYE) HIGH-SPEED FLAG HAS BEEN SET

PRINTED CIRCUIT BOARD FABRICATION METHOD

CROSS-REFERENCE TO RELATED APPLICATIONS

This application is based upon and claims the benefit of priority of the prior Japanese Patent Application No. 2008-140930, filed on May 29, 2008, the entire contents of which are incorporated herein by reference.

FIELD

The present invention relates to a fabrication method of a printed circuit board in which a hole connecting the front and rear surfaces of the printed circuit board is formed so as to serve as a through hole, a printed circuit board fabricated by the fabrication method, and a printed circuit board fabrication apparatus and, more particularly, to a technique for reducing reflection of high frequency components by means of branching structure of the through hole.

BACKGROUND

In recent years, information throughput requirements demanded in a digital electronic device grow steadily. Accordingly, an increase in the signal speed in the digital electronic device is required. Further, capacitance requirements demanded in a printed circuit board are increased and, accordingly, the number of layers required in the printed circuit board and thickness thereof tend to increase. Along with this tendency, the stub length (T-branch portion) is increased in a through hole formed in the printed circuit board for implementation of components or establishment of electrical connection among the front and rear surfaces of the printed circuit board and respective layers. As a result, there arises a problem that signal quality is degraded due to reflection of high frequency components occurring at the portion at which the stub length is increased. To solve this problem, there has been conventionally provided a technique (called "back drilling") of cutting (removing) the T-branch portion of the through hole using a drill as a printed circuit board fabrication method.

An example of the conventional back drilling technique will be described using FIGS. 59 and 60, which illustrate a cross-sectional view of the inside of a through hole before and after application of back drilling, respectively.

As illustrated in FIG. 59 which illustrates a state before application of back drilling, a through hole 46 is formed by providing a plating layer 48 made of a conductive material in a hole penetrating through a base (base material of a printed circuit board) 47. A lead wire 49 for establishing electrical connection with mounted components and other layers is connected to the through hole 46, and the plating layer 48 perpendicularly extending from the lead wire 49 along the surface of the through hole 46 forms a T-branch 50.

Next, a procedure of a conventional T-branch cutting method will be described. A not illustrated drill is inserted into the through hole 46 from above and cuts the T-branch 50 illustrated in FIG. 59 in the manner as illustrated in FIG. 60. Thereafter, the drill is pulled out of the through hole 46, whereby the cutting of the T-branch 50 is ended.

Thus, by cutting the unnecessary T-branch portion according to the conventional T-branch cutting method, degradation of signal quality due to reflection of high frequency component can be reduced.

Adoption of a build-up board can be taken up as another approach for eliminating the T-branch. However, this approach involves an increase of cost and therefore is not widely used now.

As prior arts relating to the present invention, a printed circuit board fabrication method that cuts a stub (T-branch) without leaving the plating layer of the through hole (refer to, e.g., Patent Document 1: Japanese Laid-Open Patent Publication No. 2005-26549); a working method that forms a groove on the inner surface of a cylinder having a small diameter (refer to, e.g., Patent Document 2: Japanese Laid-Open Patent Publication No. 6-315784); and a laser beam machining apparatus capable of machining an inner face of a tube having a small inside diameter (refer to, e.g., Patent Document 3: Japanese Laid-Open Patent Publication No. 2005-313191) are known.

However, in the conventional back drilling technique, the entire plating layer 48 except for the portion at which the lead wire 49 is provided is removed as illustrated in FIG. 60, so that connectors may not be mounted on both sides of the resultant printed circuit board, which is disadvantageous in terms of mounting efficiency. Further, in the case where the conventional back drilling technique is used, the inner wall surface of the through hole 46 is subjected to cutting at many portions to expose the base 47, so that the amount of moisture absorption through the cut portions of the inner surface of the through hole 46 is increased, which may result in deterioration of substrate characteristics.

SUMMARY

According to an aspect of the present invention, there is provided a fabrication method of a printed circuit board including a through hole constituted by a hole penetrating through the front and rear surfaces of the printed circuit board, the fabrication method including, applying conductive material plating to the inner wall surface of the hole to form a through hole electrically connecting the front and rear surfaces of the printed circuit board, and removing the conductive material plated on the hole inner wall surface at least at a portion between the front and rear surfaces of the printed circuit board is carried out to thereby fabricate a printed circuit board having a through hole electrically isolates the front surface of the printed circuit board from the rear surface thereof.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Embodiments of the present invention will be described below with reference to the accompanying drawings.

Figure 61:
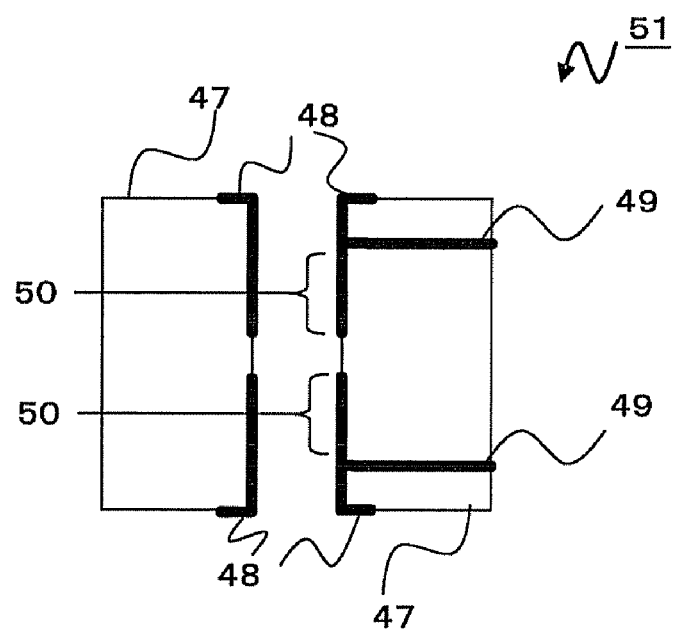
FIG. 61 is a cross-sectional view of a through hole, which illustrates an overview according to the embodiments of the present invention.

First, an overview of the embodiments of the present invention will be described with reference to FIGS. 61 and 62. FIG. 61 is a cross-sectional view of a through hole, which illustrates an overview of the embodiments of the present invention, and FIG. 62 is a cross-sectional view illustrating a state where connectors are provided in the through hole of FIG. 61.

A typical configuration of a through hole is such that a conductive material is plated onto the inner wall surface of a hole penetrating through a base of a printed circuit board so as to provide a plating layer and that a lead wire connected to one or plurality of wiring layers through the plating layer is connected to one external terminal, or the lead wires connected to a plurality of wiring layers are connected to each other.

Figure 60:
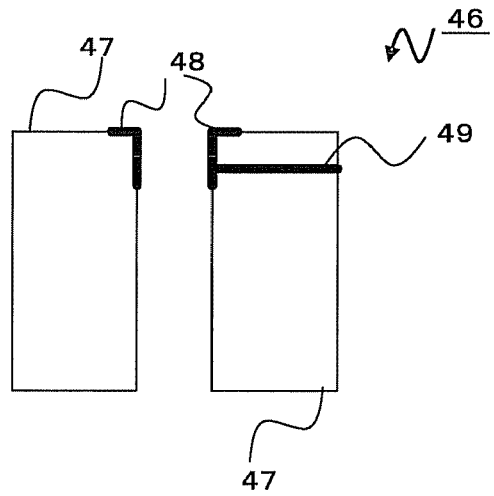
FIG. 60 is a cross-sectional view of the inside of a through hole after application of back drilling.

In contrast, FIG. 61 illustrates a through hole 51 having a structure for allowing lead wires 49 in two respective layers to be connected to different external connection terminals (external connection terminals provided on both the front and rear surfaces of the printed circuit board) or connected to lead wires of not illustrated other respective layers. In FIGS. 61 and 62, the same reference numerals as those in FIG. 60 denote the same or corresponding parts as those in FIG. 60, and the overlapped description is omitted.

Figure 62:
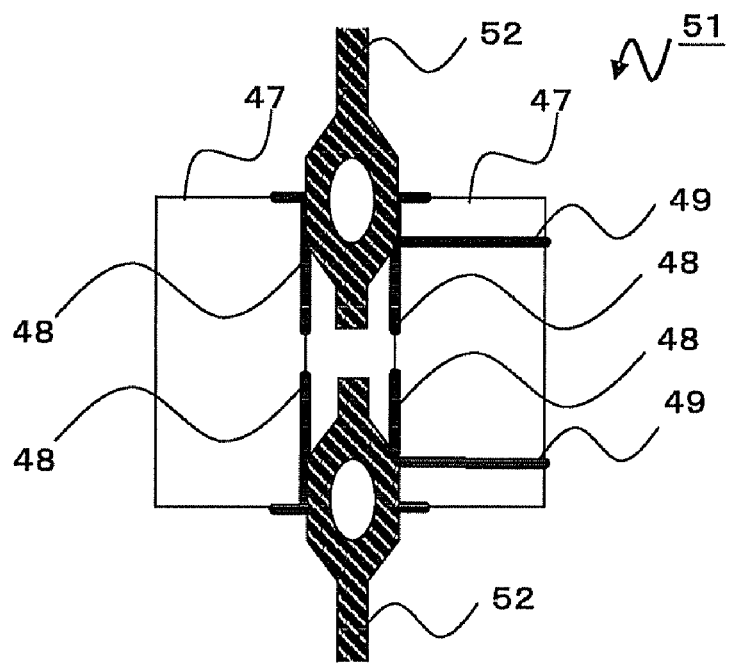
FIG. 62 is a cross-sectional view illustrating a state where connectors are provided in the through hole of FIG. 61.

In the through hole 51 illustrated in FIGS. 61 and 62, the inner surface thereof is circularly cut at its intermediate portion, whereby the electrical connection between the front and rear surfaces of the printed circuit board is disconnected. As a result, the length of a T-branch 50 which may cause reflection of a high-speed signal can be shortened. Further, since the inner wall plating layer 48 corresponding to a portion serving as the T-branch 50 is left without being cut, it is possible to use this portion to connect to a connection wire in not illustrated another layer.

Further, as illustrated in FIG. 62, in the through hole 51 having the above configuration, it is possible to connect connectors 52 which are inserted into the through hole 51 from both the front and rear sides of the printed circuit board and their corresponding lead wires 49 respectively, allowing the connectors 52 to be mounted on both sides of the printed circuit board. Further, the area of the plating layer 48 to be cut can be reduced as compared to conventional T-branch cutting methods, thereby suppressing characteristics deterioration due to moisture absorption. More detailed descriptions will be made below.

First Embodiment

In the present embodiment, a formation of a through hole electrically connecting the front and rear surfaces of the printed circuit board are electrically disconnected by disconnecting, using laser machining, an electrode made of a conductive material which is plated on the inner wall surface of a hole penetrating through the printed circuit board will be described. In the following description, the same reference numerals denote the same parts through the drawing, and the overlapped description is omitted.

Figure 1:
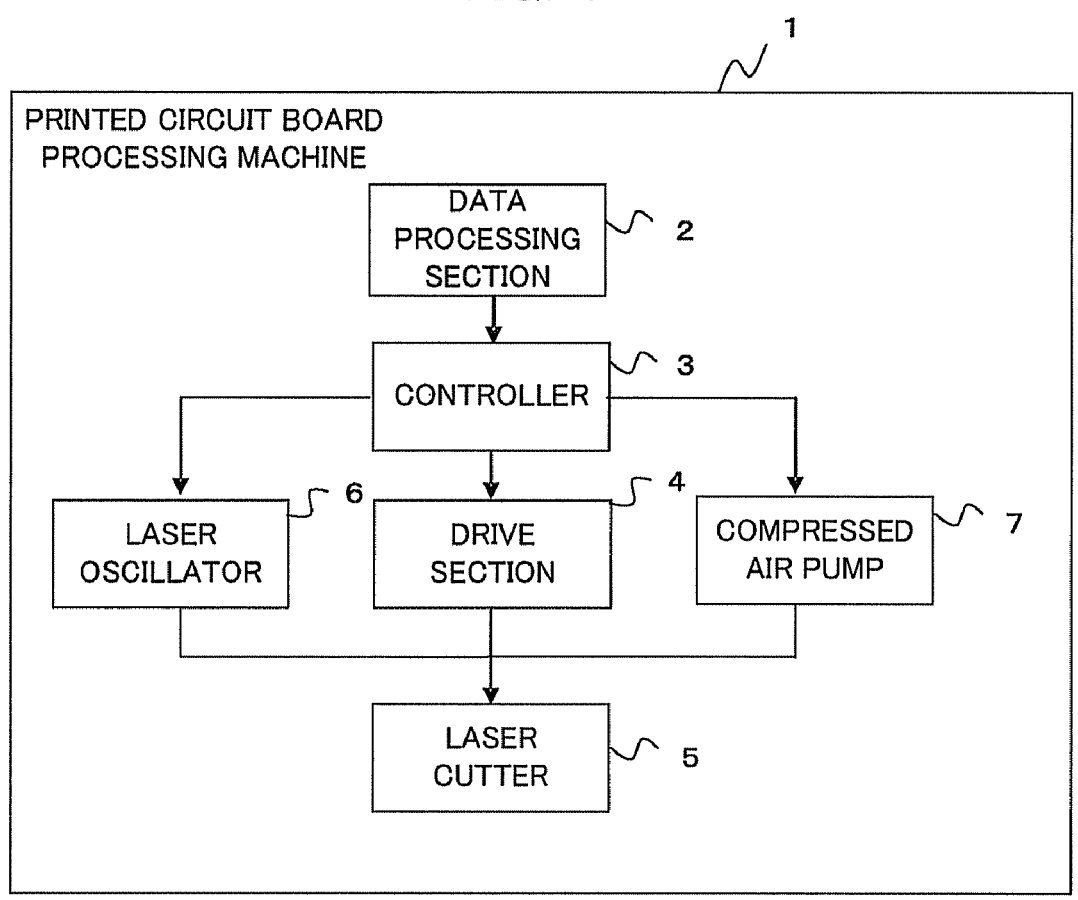
FIG. 1 is a block diagram illustrating an example of a configuration of a printed circuit board processing machine (printed circuit board fabrication apparatus) according to a first embodiment of the present invention.
Figure 2:
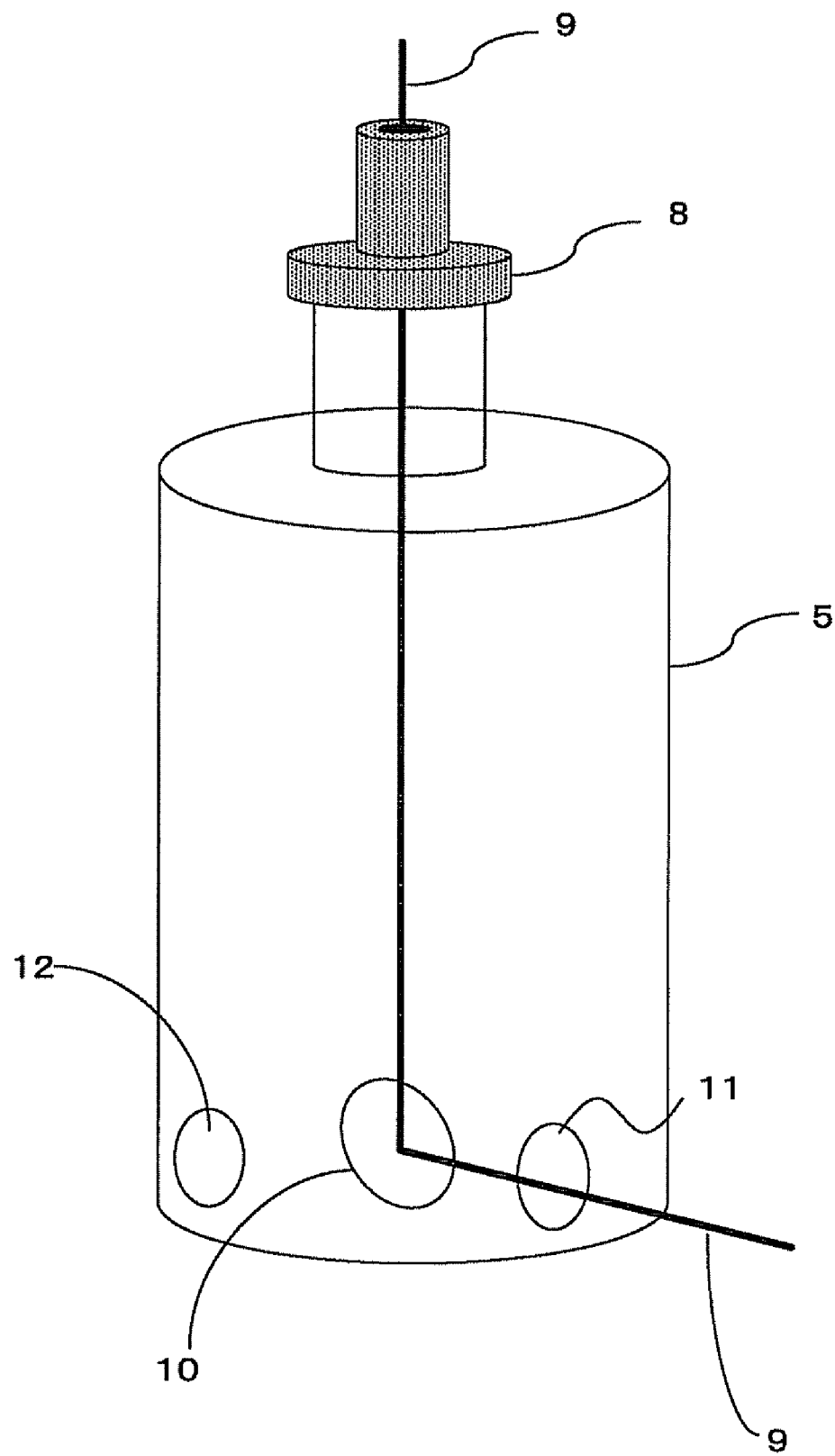
FIG. 2 is a configuration diagram illustrating the details of a laser cutter according to the first embodiment.
Figure 3:
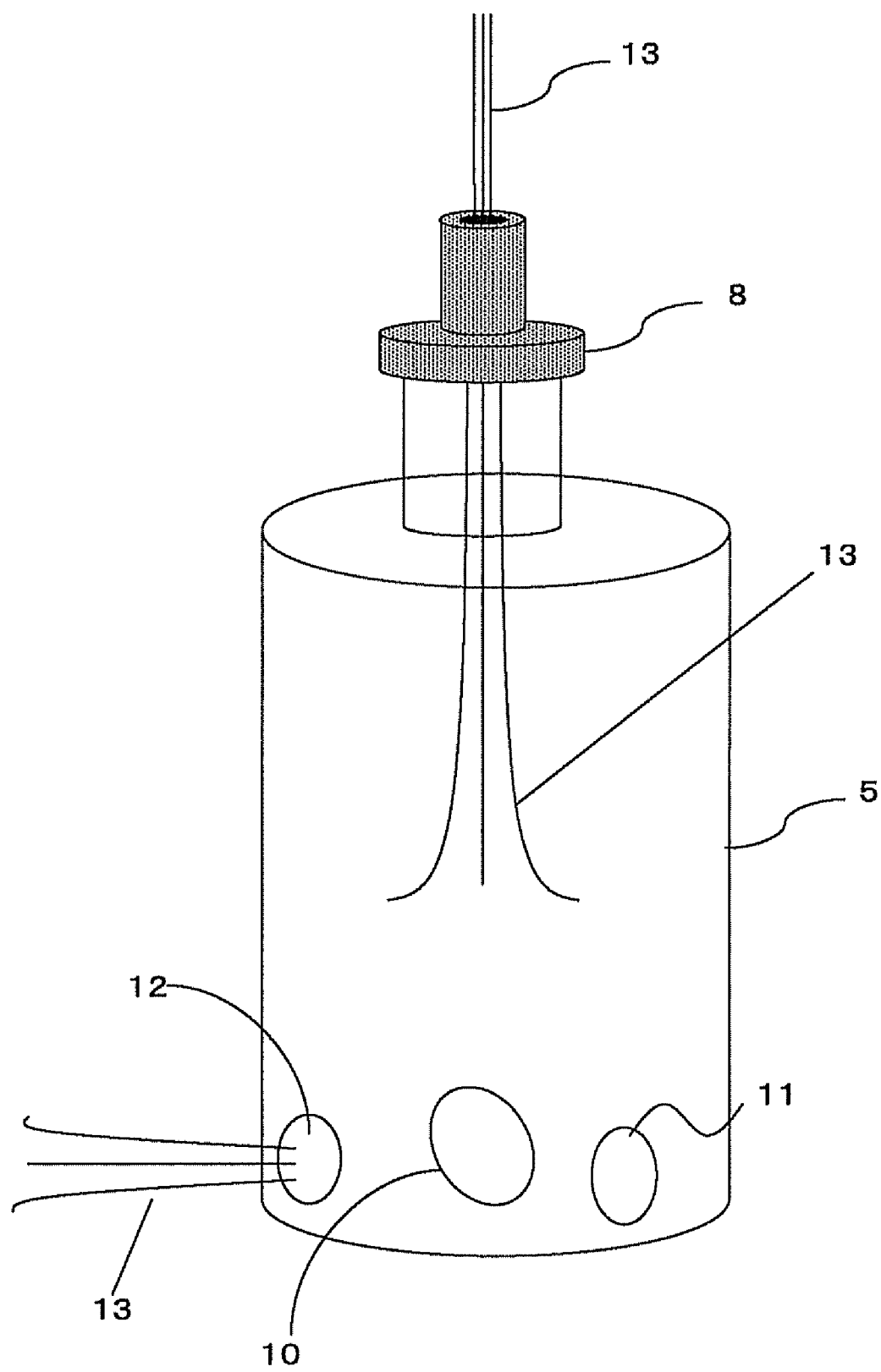
FIG. 3 is a view for explaining a state where the laser cutter according to the present embodiment blows compressed air.

FIG. 1 is a block diagram illustrating an example of a configuration of a printed circuit board processing machine (printed circuit board fabrication apparatus) according to the first embodiment of the present invention. FIG. 2 is a configuration diagram illustrating the details of a laser cutter. FIG. 3 is a view for explaining a state where the laser cutter blows compressed air. The printed circuit board processing machine 1 illustrated in FIG. 1 includes a data processing section 2, a controller 3, a drive section 4, a laser cutter 5, a laser oscillator 6, and a compressed air pump 7.

The data processing section 2 receives design data, performs data processing to be described later based on the design data, and outputs the resultant data to the controller 3. The design data includes lead wire layer information, layer configuration information, and plate thickness information. The controller 3 controls operations of the drive section 4, laser cutter 5, laser oscillator 6, and air compressed pump 7. The drive section 4 moves or rotates the laser cutter 5.

As illustrated in FIG. 2, the laser cutter 5 has a bearing 8, a mirror 10, and an irradiation port 11. The bearing 5 is mounted at the connection portion to the drive section 4. The mirror 10 has a planar form inclined at about 45° with respect to the incident angle of laser 9 emitted from the laser oscillator 6 and reflects the laser 9 that enters the mirror in parallel with the axis of the through hole at substantially right angles. The laser 9 reflected by the mirror 10 travels through the irradiation port 11 from the inside of the laser cutter 5 to the through hole inner wall. Further, in the present embodiment, the laser cutter 5 receives supply of compressed air to thereby blow compressed air through a blowing port 12 provided in the laser irradiation port.

As illustrated in FIG. 3, compressed air 13 supplied from the compressed air pump 7 is passed through the inside of the laser cutter 5 and blown through the blowing port 12. The laser oscillator 6 emits the laser 9 toward the inside of the laser cutter 5. The compressed air pump 7 introduces the compressed air 13 into the inside of the laser cutter 5.

The data processing section 2, controller 3, drive section 4, laser cutter 5, and laser oscillator 6 constitute a cutting means of the present invention. The compressed air pump 7 constitutes a cleaning means of the present invention.

An outline of operation of the printed circuit board processing machine according to the present embodiment will next be described.

Figure 4:
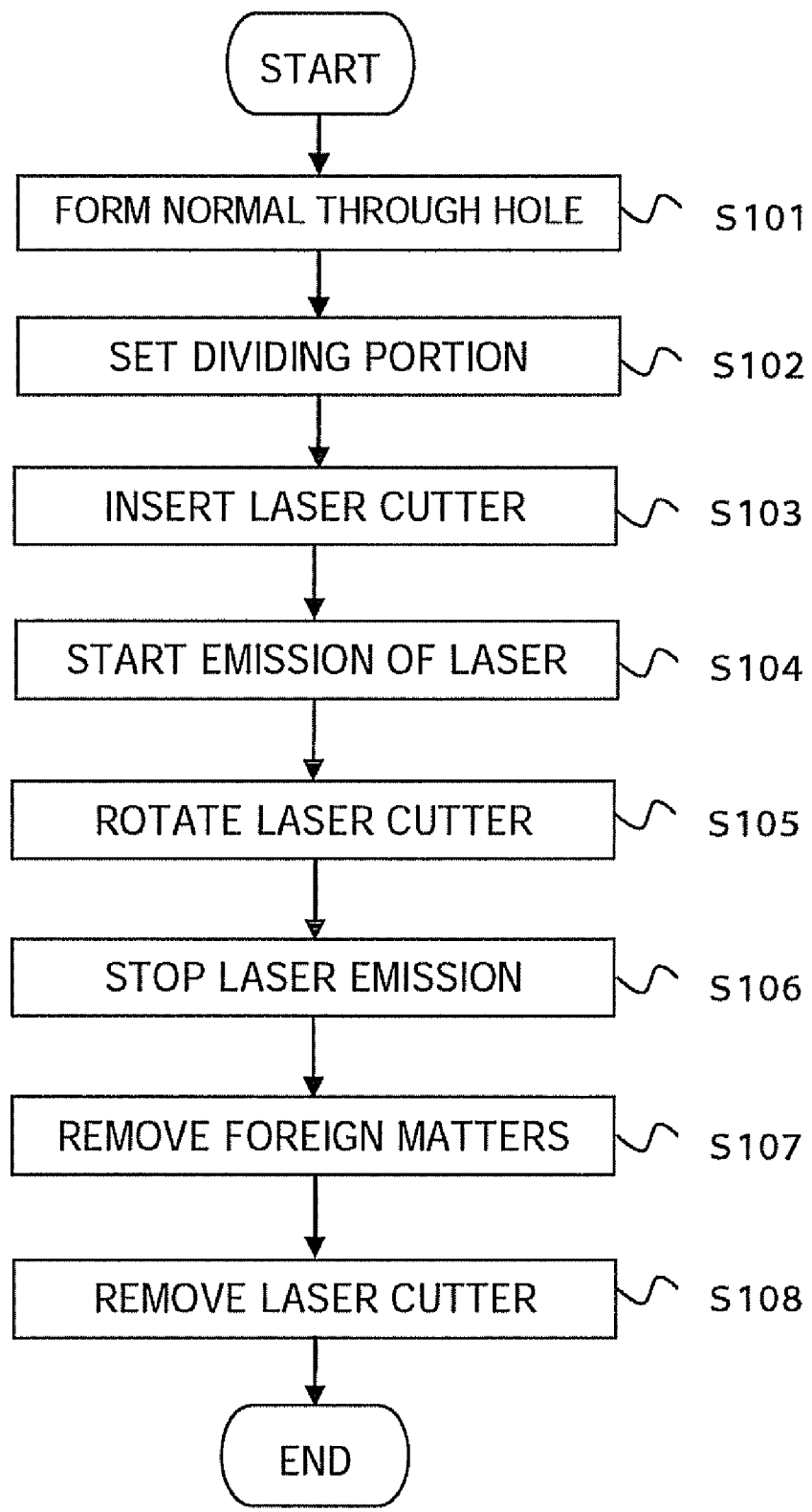
FIG. 4 is a flowchart illustrating an example of operation of a through hole forming method according to the first embodiment.

FIG. 4 is a flowchart illustrating an example of operation of a through hole forming method according to the first embodiment. First, a through hole forming machine and a plating machine (which are not illustrated) are used to form a through hole electrically connecting the front and rear surfaces of the printed circuit board (S101).

Figure 5:
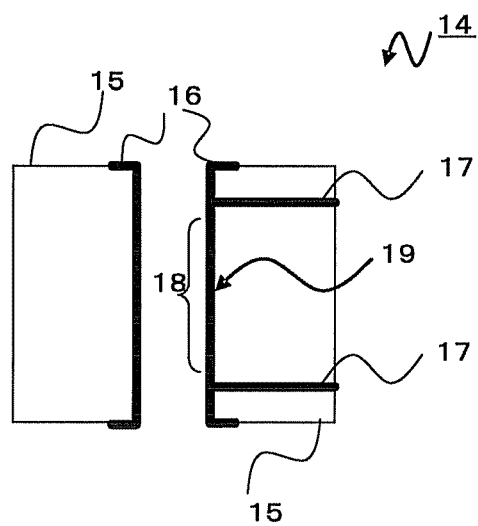
FIG. 5 is a cross-sectional view of a through hole according to the first embodiment.

FIG. 5 is a cross-sectional view of a thus formed through hole according to the first embodiment. A through hole 14 formed in step S101 includes, as illustrated in FIG. 5, a base 15 which is a base material of the printed circuit board, a plating layer 16 formed onto the inner wall surface of a hole penetrating through the front and rear surfaces of the base 15, and lead wires 17 arranged in parallel with the front and rear surfaces of the base 15 in the vicinities of the front and rear surface sides of the base 15. A T-branch 18 is constituted by the conductive plating layer 16 of the inner wall of the through hole 14 extending between the lead wires 17. A portion at which the plating layer 16 constituting the T-branch 18 is cut is defined as a dividing portion 19 (cut portion).

After completion of step S101, the controller 3 sets the position of the T-branch dividing portion 19 (S102). In the following, the details of the position setting process of the dividing portion 19 will be described with reference to FIGS. 6 to 10.

Figure 6:
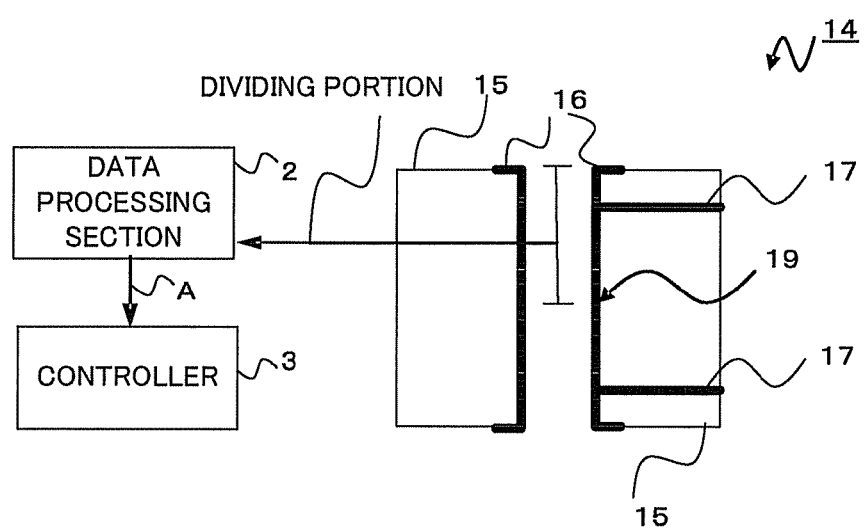
FIG. 6 is a view for explaining a position setting process of a dividing portion in the first embodiment.

FIG. 6 is a view for explaining the position setting process of the dividing portion in the first embodiment. As illustrated in FIG. 6, the controller 3 acquires the position of the dividing portion from the data processing section 2 as depth information A and outputs a drive signal corresponding to the depth information A to the drive section 4 illustrated in FIG. 1. The depth information A indicates the depth of the dividing portion 19 from the surface of the base 15.

Figure 7:
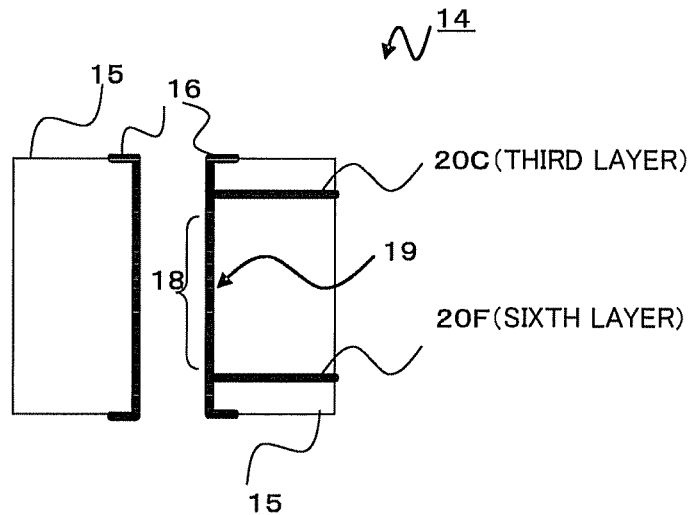
FIG. 7 is a view for explaining acquisition of depth information A in the first embodiment, which illustrates a case where lead wire layer information is constituted by lead wires in third and sixth layers.
Figure 8:
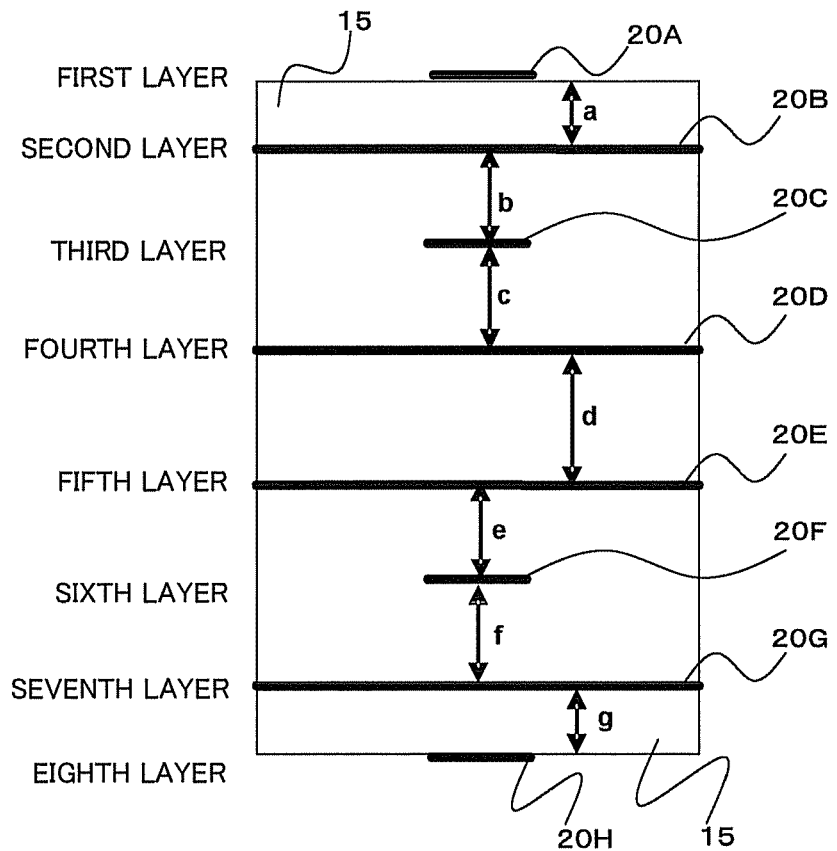
FIG. 8 is a view illustrating a lead wire 20C in the third layer and a lead wire 20F in the sixth layer of FIG. 7 using information concerning the entire layer configuration in the printed circuit board and plate thickness information.

FIGS. 7 and 8 are views for explaining acquisition of the depth information A. These drawings illustrate a case where the abovementioned lead wire layer information is constituted by lead wires in third and sixth layers. FIG. 8 is a view illustrating a lead wire 20C in the third layer and a lead wire 20F in the sixth layer using information concerning the entire layer configuration in the printed circuit board and plate thickness information. In FIG. 8, lead wires in respective layers are represented as 20B to 20G, and plate thicknesses of respective layers are represented as a to g. In a depth information determination process using the lead wire layer information, layer configuration information, and plate thickness information, the data processing section 2 calculates the physical position of the lead wire in the layer direction by summation of the respective layer thickness. Note that 20A and 20H illustrated in FIG. 8 denote electrodes provided on the front and rear surfaces of the printed circuit board.

For example, as illustrated in FIG. 8, the depth of the lead wire in the third layer in the printed circuit board is calculated by [a+b]. The depth of the lead wire in the sixth layer is calculated by [a+b+c+d+e]. The data processing section 2 has previously acquired the design data of the printed circuit board.

The design data retains a high-speed flag for identifying a high-speed signal net. When performing the depth information determination process, the data processing section 2 makes the stub length on the side of the lead wire to which the high-speed flag has been set shorter than the stub length on the side of the lead wire to which the high-speed flag is not set in the state after a dividing process of the T-branch 18 of the through hole 14 (or lead wire information or wiring layer information).

Figure 9:
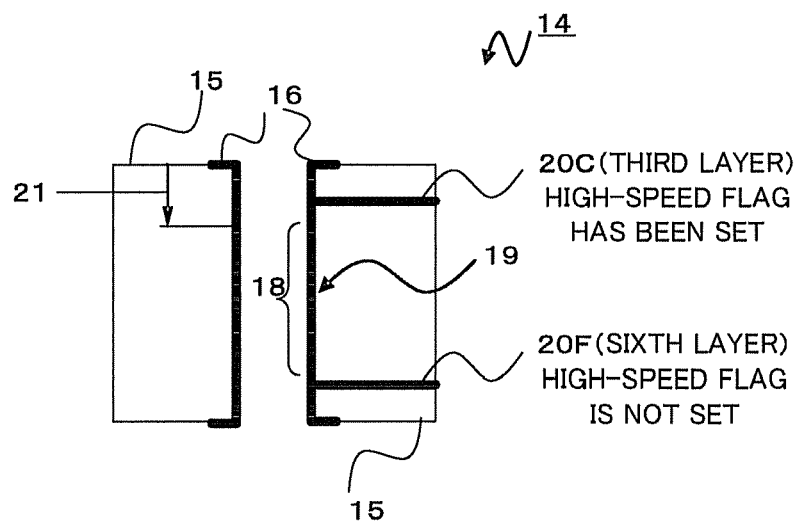
FIG. 9 is a view for explaining determination of a dividing position in the first embodiment in the case (case F1) where a high-speed flag has been set only in one side of a divided through hole 14.

FIG. 9 is a view for explaining determination of the dividing position in the first embodiment in the case (case F1) where the high-speed flag has been set only in one side of the divided through hole 14. As illustrated in FIG. 9, the high-speed flag has been set to the lead wire 20C in the third layer but not set to the lead wire 20F in the sixth layer.

Figure 10:
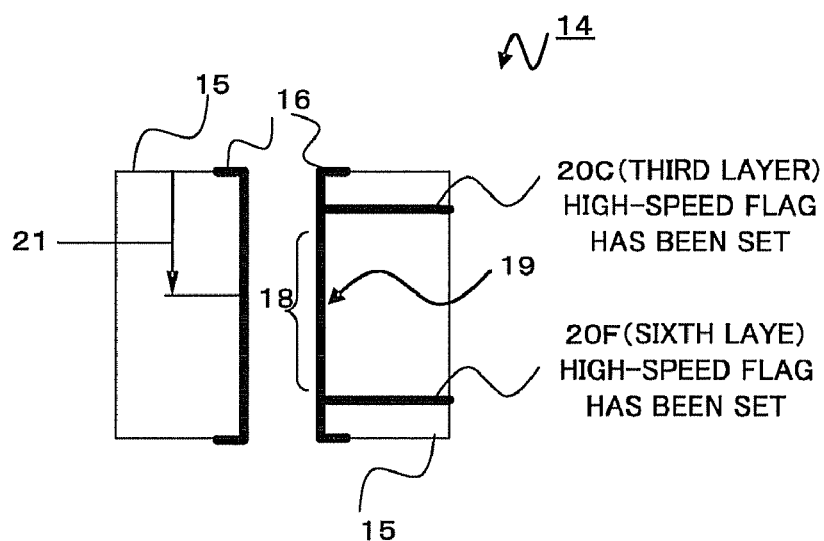
FIG. 10 is a view for explaining determination of a dividing position in the first embodiment in the case (case F2) where a high-speed flag has been set in both sides of a divided through hole 14.

FIG. 10 is a view for explaining determination of the dividing position in the first embodiment in the case (case F2) where the high-speed flag has been set in both sides of the divided through hole 14. As illustrated in FIG. 10, the high-speed flag has been set to both the lead wire 20C in the third layer and lead wire 20F in the sixth layer.

In the case of FIG. 9 (case F1), the data processing section 2 calculates the depth of the dividing portion by the following expression.

Dividing depth=depth of third layer+physically limited length

The physically limited length means the MIN value of the depth direction interval that does not destroy connection between the third layer and through hole 14, which is calculated from the accuracy of the depth setting.

According to the calculation expression of the dividing depth of case F1, the data processing section determines a dividing depth 21 such that the length of the stub on the side of the lead wire to which the high-speed flag has been set is shorter than that in the case of FIG. 10 in the state after the dividing process of the T-branch 18.

In the case of FIG. 10 (case F2), the data processing section 2 calculates the dividing depth using the following expression.

Dividing depth=(depth of third layer+depth of sixth layer)/2

That is, in the case of case F2, the data processing section 2 sets the dividing depth 21 to the midpoint between the leading wires 20C and 20F. The same can be said for the case where the high-speed flag is not set to both the lead wires 20C and 20F.

Thereafter, the controller 3 sets the dividing position based on the depth information of the dividing portion 19 which is received from the data processing section 2 (S102).

According to such dividing position setting process, the dividing position can be set in a suitable manner depending on the type of the printed circuit board.

Figure 11:
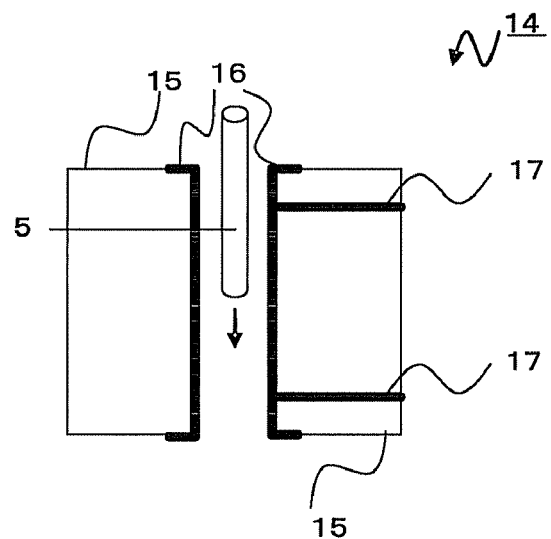
FIG. 11 is a view for explaining insertion of the laser cutter in the first embodiment.

FIG. 11 is a view for explaining insertion of the laser cutter in the first embodiment. After completion of the dividing position setting, the controller 3 controls the drive section 4 to drive the laser cutter 5. The laser cutter 5 driven by the drive section 4 is inserted into the inside of the through hole 14. When the laser cutter 5 reaches the set dividing position, the controller 3 controls the drive section 4 to stop the insertion of the laser cutter 5 (S103).

Figure 12:
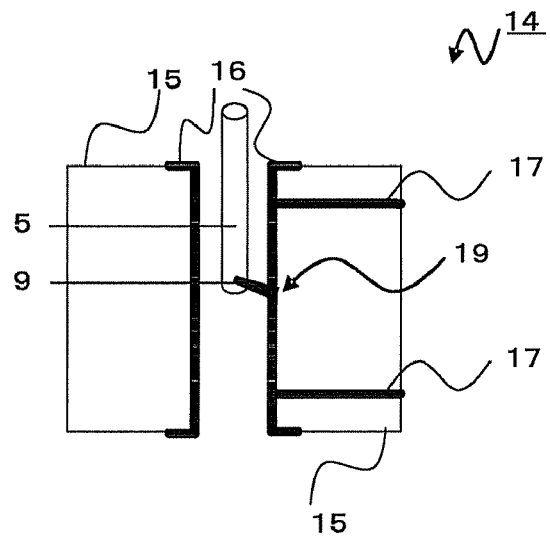
FIG. 12 is a view for explaining laser cutter irradiation in the first embodiment.

FIG. 12 is a view for explaining laser cutter emission in the first embodiment. After the laser cutter has been inserted into the inside of the laser cutter 5, the controller 3 controls the laser oscillator 6 to start emission of the laser 9. The laser 9 emitted from the oscillator 6 is reflected by the mirror 10 in the laser cutter 5 and then irradiated onto the dividing portion 19 for cutting (S104).

Figure 13:
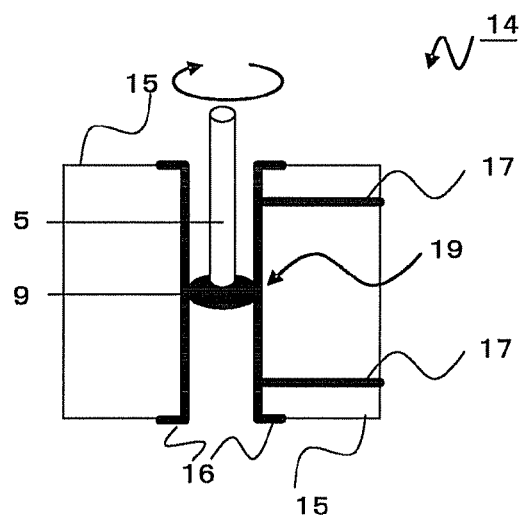
FIG. 13 is a view for explaining rotation of the laser cutter in the first embodiment.

FIG. 13 is a view for explaining rotation of the laser cutter in the first embodiment. As illustrated in FIG. 13, the control section 3 controls the laser oscillator 6 to emit the laser 9 and controls the drive section 4 to rotate the laser cutter 5 in a plane parallel to the plane of the printed circuit board. As a result, the laser 9 is irradiated, in a circular shape, onto the inner wall surface of the through hole 14 to thereby cut the through hole 14 connecting the front and rear surfaces of the printed circuit board at its dividing portion 19 (S105).

Figure 14:
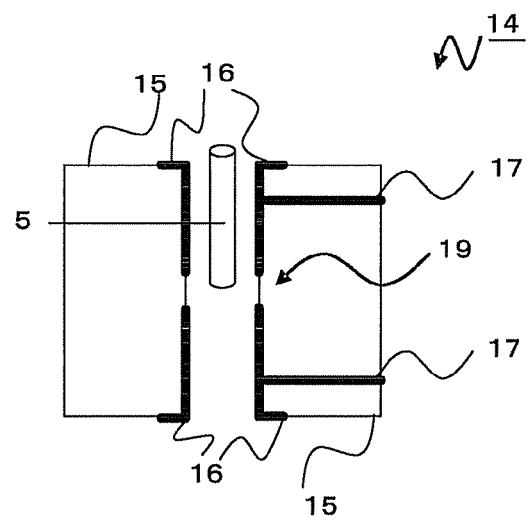
FIG. 14 is a view for explaining stop of laser emission in the first embodiment.

FIG. 14 is a view for explaining stop of the laser emission in the first embodiment. As illustrated in FIG. 14, after a sufficient irradiation time to cut the dividing portion 19 has elapsed, the controller 3 controls the laser oscillator 6 to stop emission of the laser 9 (S106).

Figure 15:
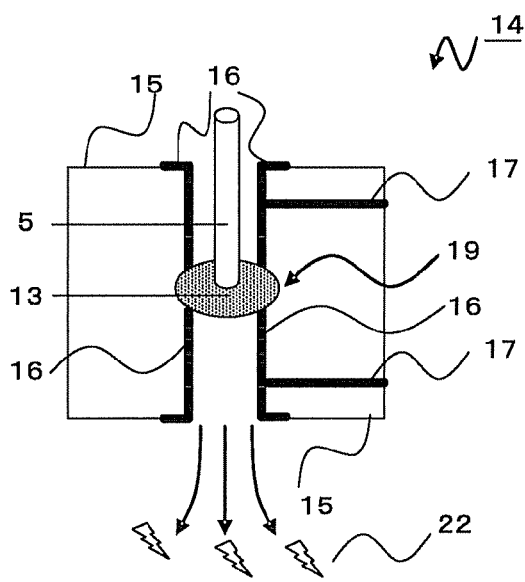
FIG. 15 is a view for explaining a process of removing foreign matters by means of compressed air in the first embodiment.

FIG. 15 is a view for explaining a process of removing foreign matters by means of compressed air in the first embodiment. As a result of the cutting of the dividing portion 19 by means of the laser 9, foreign matters 22 such as plating residues or circuit board residues are generated, which may adversely affect electrical characteristics, as illustrated in FIG. 15. To avoid this, the controller 3 causes the compressed air 13 to be supplied from the compressed air pump 7 to the inside of the laser cutter 5. The compressed air 13 supplied to the inside of the laser cutter 5 is then blown from the laser cutter 5 to remove the foreign matters 22 with its wind pressure (S107). FIG. 15 illustrates a state where the divided through hole 14 is cleaned by removing the foreign matters 22 generated as a result of the cutting of the plating layer 16 by means of the blowing of the compressed air 13.

Figure 16:
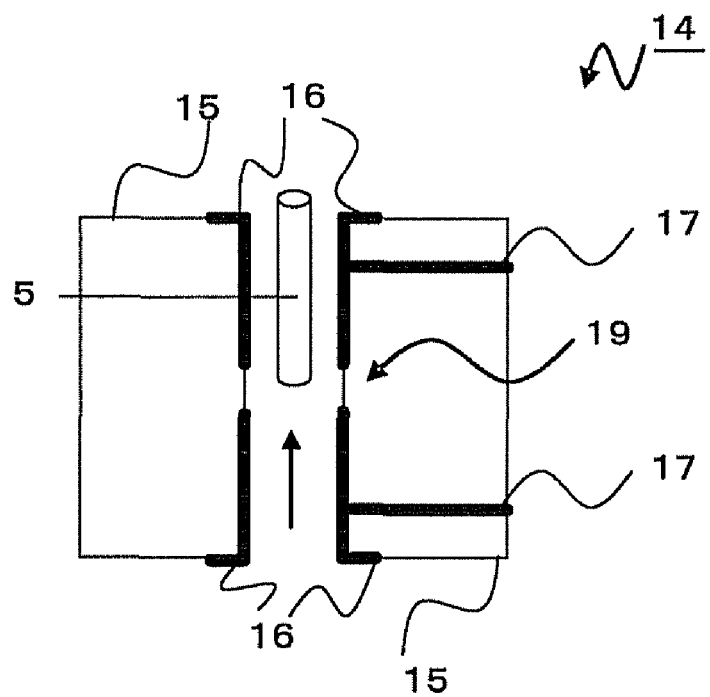
FIG. 16 is a view illustrating removal of the laser cutter in the first embodiment.

FIG. 16 is a view illustrating removal of the laser cutter in the first embodiment. As illustrated in FIG. 16, after the removal of the foreign matters 22, the controller 3 controls the drive section 4 to stop the rotation of the laser cutter 5 and to remove the laser cutter 5 from the through hole 14 (S108), and this flow is ended.

According to the present embodiment, by inserting the laser cutter into the through hole and by irradiating the dividing portion with the laser while rotating the laser to cut the T-branch, a through hole having a shape capable of reducing stub reflection can be obtained at low cost. Further, respective segments of the through hole obtained by the dividing process can be used as connection terminals, thereby increasing mounting efficiency. Further, by blowing compressed air toward the inner wall surface of the through hole, it is possible to effectively eliminate foreign matters which may adversely affect electrical characteristics. Further, the length of the cut portion of the T-branch is significantly shorter than in the case of the conventional back drilling technique, so that it is possible to suppress deterioration of characteristics due to moisture absorption, thus giving an advantage to a printed circuit board fabrication technique. As described above, according to the present embodiment, it is possible to increase the mounting efficiency about two times than that in conventional approach and to reduce the cost rate and deterioration level of characteristics due to moisture absorption to about $\frac{1}{4}$ and $\frac{1}{2}$, respectively.

Second Embodiment

Although the cleaning by means of the compressed air is carried out after the dividing process of the through hole by means of the laser in the above first embodiment, the cleaning may be carried out simultaneously with the cutting process (operation) by means of the laser emission.

Figure 17:
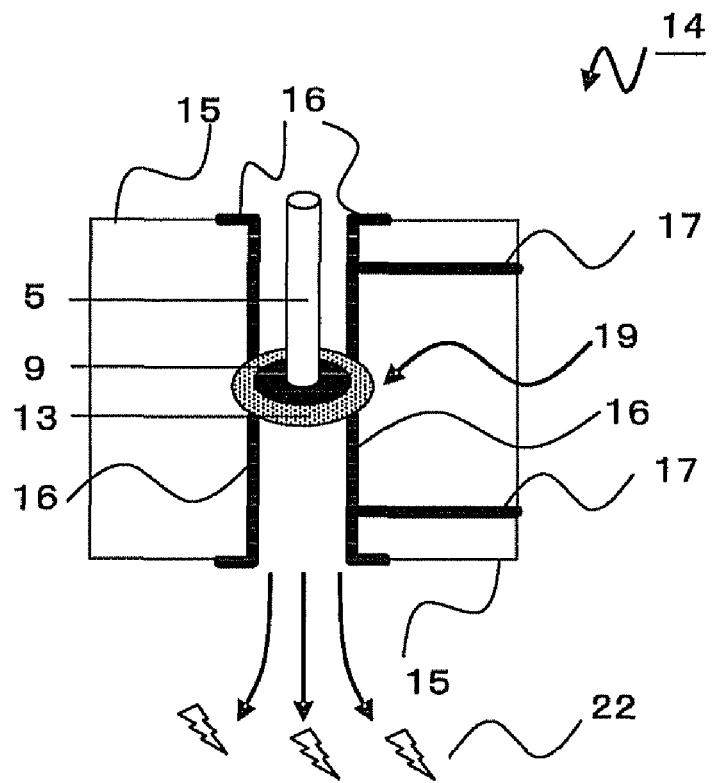
FIG. 17 is a view for explaining a state where laser emission and blowing of the compressed air are carried out simultaneously.

FIG. 17 is a view for explaining a state where laser emission and blowing of the compressed air are carried out simultaneously. In this configuration, the cutting process is carried out while the compressed air pump section 7 outputs the compressed air 13 under the control of the controller 3. That is, the cutting process can be carried out while blowing away dust and dirt to prevent contamination of the mechanism such as the mirror 10, thereby maintaining processing accuracy. Further, the cleaning operation can be completed substantially simultaneously with the end of the cutting process, thereby saving the time cost.

Third Embodiment

In the above first and second embodiments, a description is made of a case where the cut through hole is cleaned by means of blowing of the compressed air. However, the present invention is not limited to this, but a configuration in which a brush is attached to the laser cutter may also be employed. In this case, a cleaning process is carried out using the brush after the cutting process (dividing process: S101 to S106), and then the compressed air is blown to remove the foreign matters. The third embodiment will explain an example of such a configuration.

Figure 18:
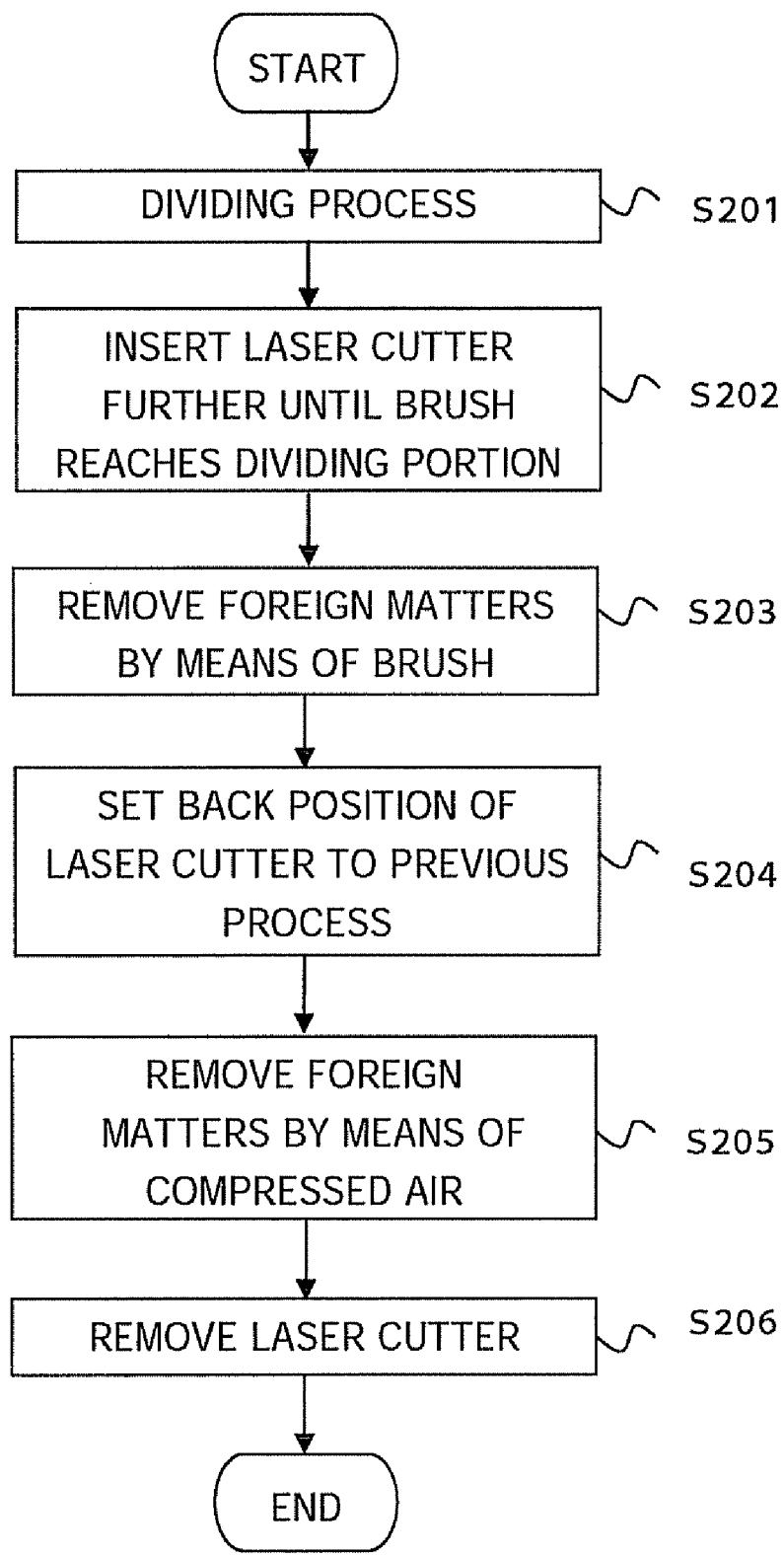
FIG. 18 is a flowchart illustrating operation of a third embodiment.
Figure 19:
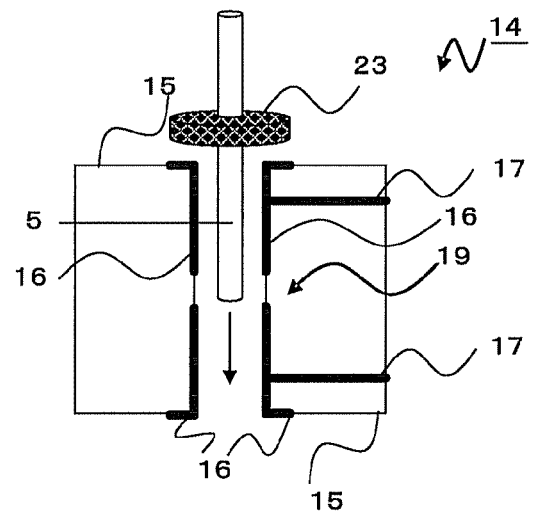
FIG. 19 is a view for explaining insertion of a brush in the third embodiment.
Figure 20:
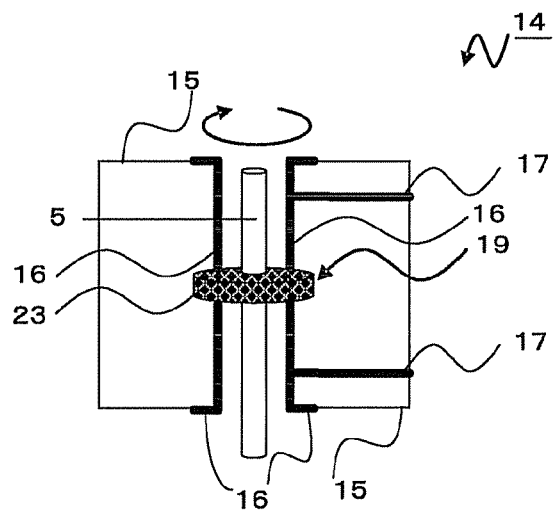
FIG. 20 is a view for explaining rotation of the brush in the third embodiment.
Figure 21:
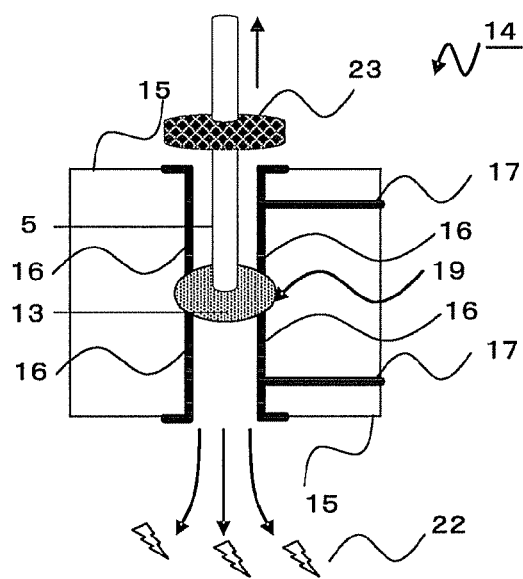
FIG. 21 is a view for explaining removal of the brush in the third embodiment.

FIG. 18 is a flowchart illustrating operation of the third embodiment, and FIGS. 19 to 21 are views for explaining respective steps of the operation.

After completion of the dividing process (S201 of FIG. 18) corresponding to the processing from S101 to S106 of FIG. 4, the controller 3 controls the drive section 4 to insert the laser cutter 5 further into the through hole 14 as illustrated in FIG. 19 until a brush 23 attached to the laser cutter 5 reaches the dividing portion 19 (S202). Then, as illustrated in FIG. 20, the controller 3 controls the drive section 4 to rotate the laser cutter 5 to cause the rotating brush 23 to remove the foreign matters 22 (S203). After that, as illustrated in FIG. 21, the controller 3 controls the drive section 4 to set back the position of the laser cutter 5 to the cutting position in the dividing process (S204) and performs cleaning of the through hole 14 (S205). That is, at the cutting position, the laser cutter 5 blows the compressed air 13 to remove the foreign matters 22 under the control of the controller 3. After that, the controller 3 controls the drive section 4 to remove the laser cutter 5 from the through hole 14 (S206).

According to the third embodiment, the process of removing the foreign matters by means of the rotating brush can be carried out in a state where the laser cutter is inserted into the through hole, thus increasing time efficiency. Further, it is possible to improve removal performance of the foreign matters, whereby foreign matters rigidly adhered to the dividing portion and the like of the through hole can be removed.

Fourth Embodiment

In the above embodiments, the cleaning of the through hole is carried out by means of the compressed air or brush. Alternatively, however, the foreign matters can be removed by blowing cleaning solution. Examples of the cleaning solution include detergent, water, and alcohol.

Figure 22:
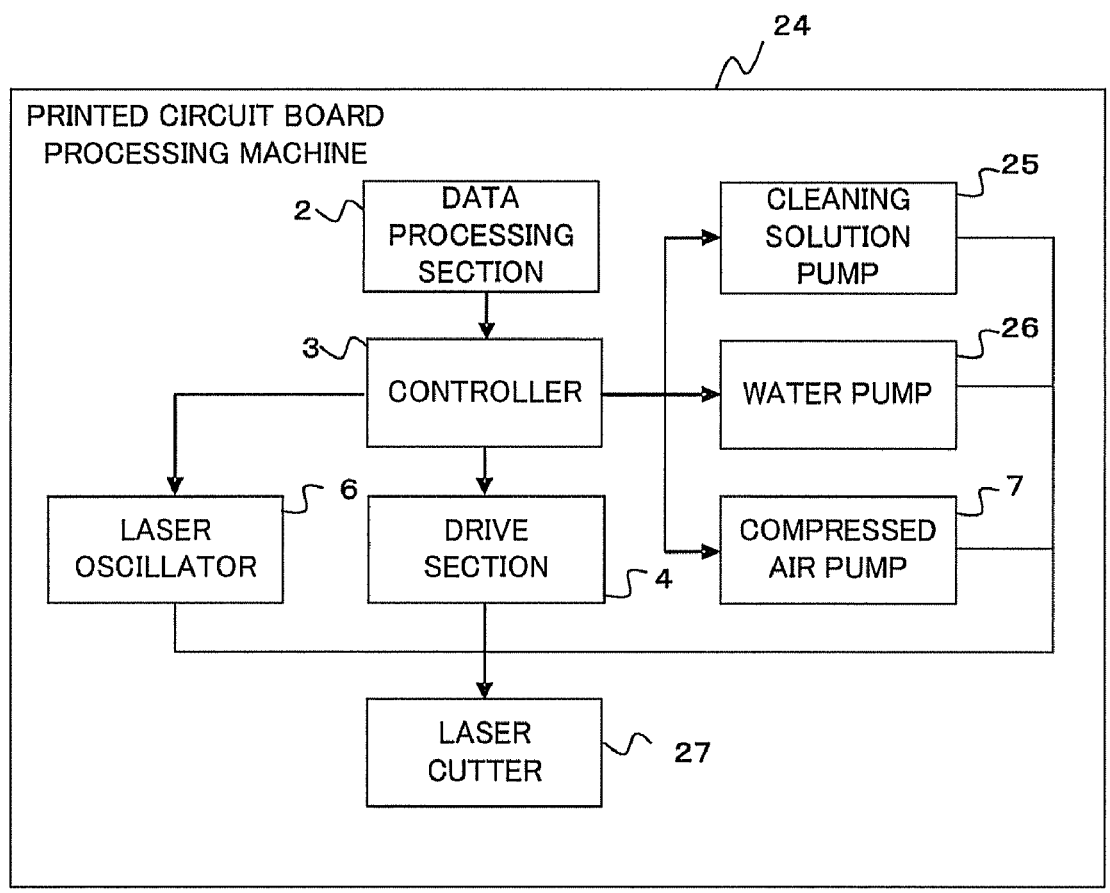
FIG. 22 is a block diagram illustrating an example of a configuration of a printed circuit board processing machine according to a fourth embodiment.
Figure 23:
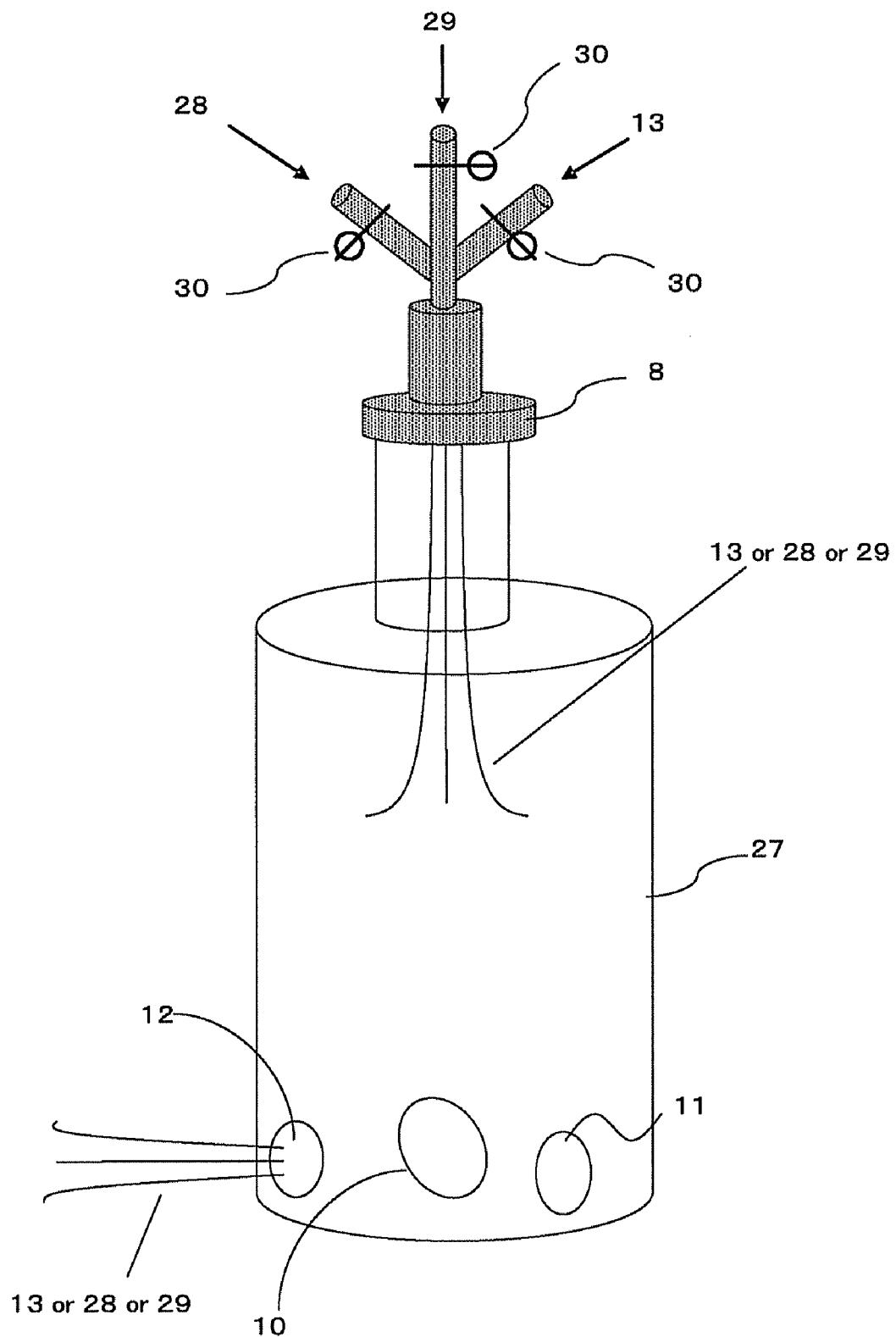
FIG. 23 is a configuration view of the details of a laser cutter of the printed circuit board processing machine according to the fourth embodiment.

FIG. 22 is a block diagram illustrating an example of a configuration of a printed circuit board processing machine according to the fourth embodiment. FIG. 23 is a configuration view of the details of a laser cutter of the printed circuit board processing machine according to the fourth embodiment. As compared to the printed circuit board processing machine illustrated in FIG. 1, a printed circuit board processing machine 24 of FIG. 22 newly includes a cleaning solution pump 25 and a water pump 26. As illustrated in FIG. 23 a laser cutter 27 newly includes feed pipes for supplying cleaning solution 28, water 29, and compressed air 13 and control valves 30 for controlling supply of the cleaning solution 28, water 29, and compressed air 13.

The cleaning solution pump 25 is provided for feeding the cleaning solution 28 into the laser cutter 27 and the water pump 26 is provided for feeding the water 29 into the laser cutter 27.

Operation of the printed circuit board processing machine according to the present embodiment will next be described.

Figure 24:
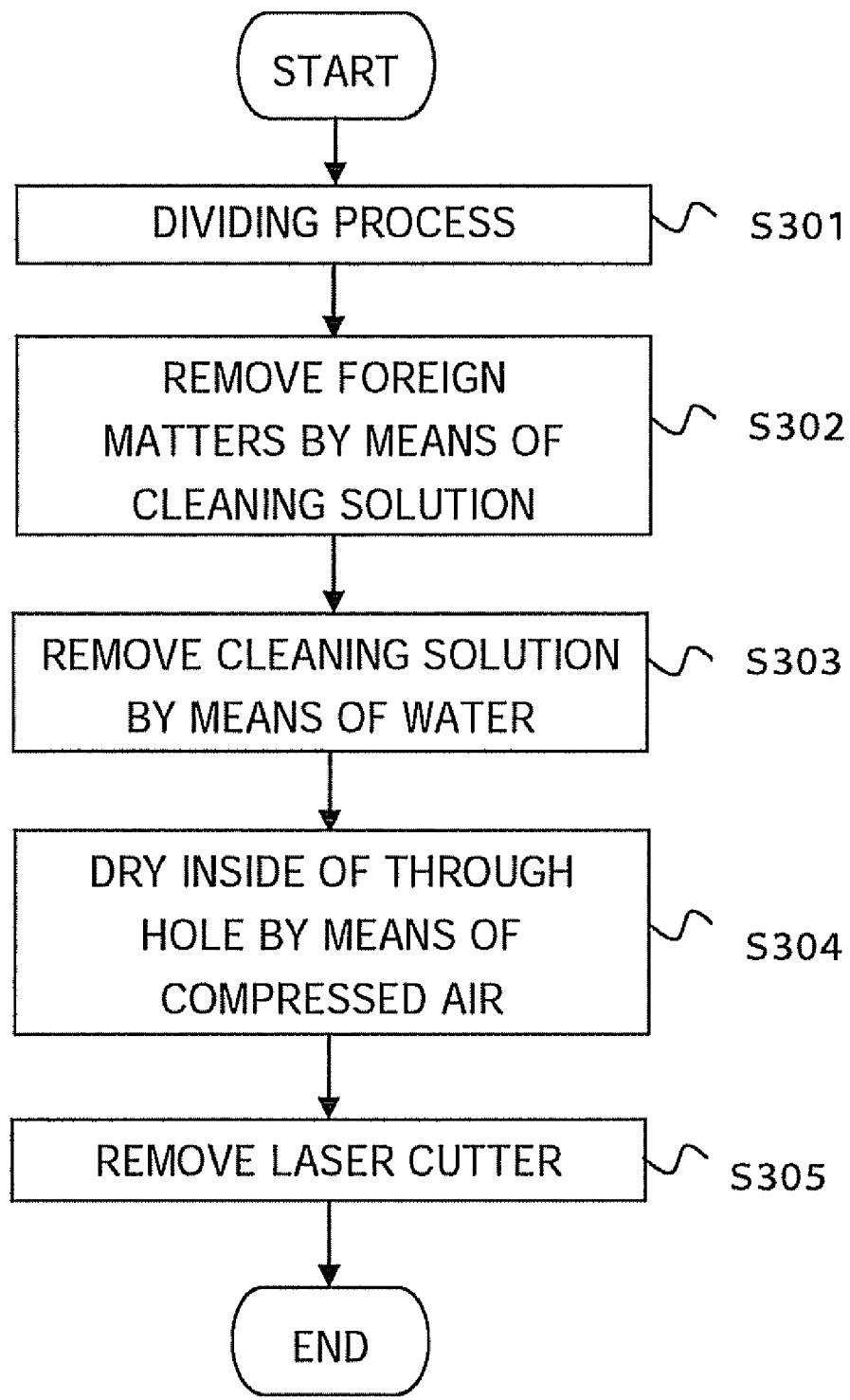
FIG. 24 is a flowchart illustrating operation of the fourth embodiment.
Figure 25:
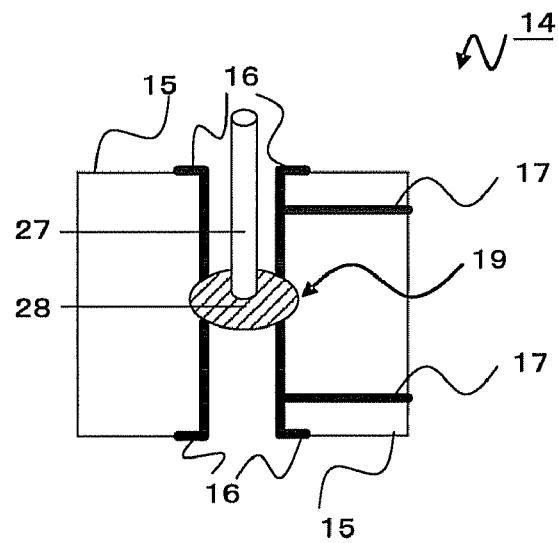
FIG. 25 is a view for explaining removal of foreign matters by means of cleaning solution in the fourth embodiment.
Figure 26:
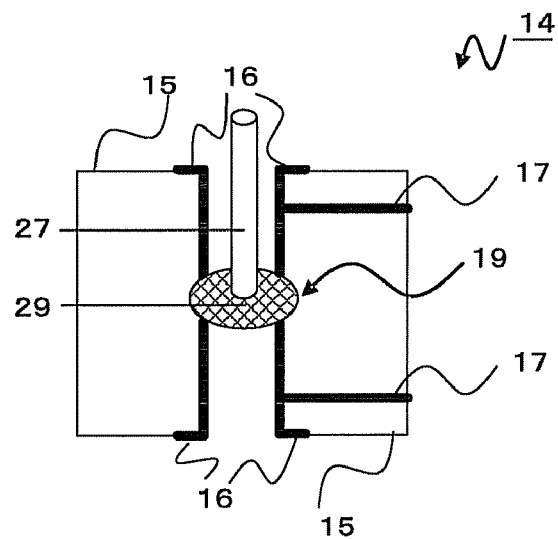
FIG. 26 is a view for explaining removal of the cleaning solution in the fourth embodiment.
Figure 27:
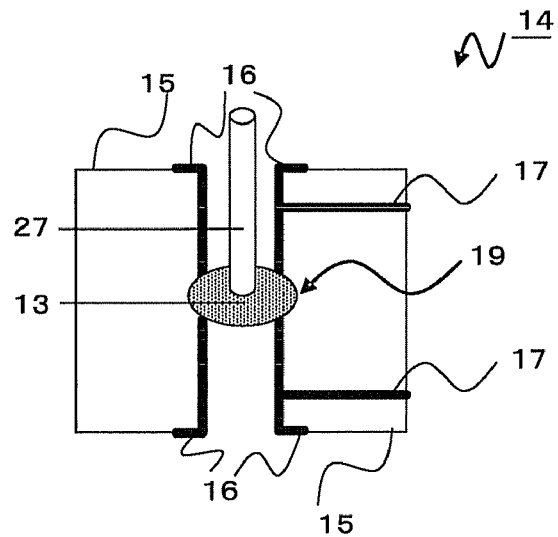
FIG. 27 is a view for explaining a drying process by means of the compressed air in the fourth embodiment.

FIG. 24 is a flowchart illustrating operation of the fourth embodiment, and FIGS. 25 to 27 are views for explaining preferable parts of the operation.

After completion of the dividing process (S301) by means of the laser cutter 27, the controller 3 feeds the cleaning solution 28 from the cleaning solution pump 25 into the laser cutter 27. The laser cutter 27 into which the cleaning solution 28 is fed blows the cleaning solution 28 from its blowing port 12 as illustrated in FIG. 25 (S302). Then, as illustrated in FIG. 26, the controller 3 feeds the water 29 from the water pump 26 into the laser cutter 27. The laser cutter 27 into which the water 29 is fed blows the water 29 from the same blowing port 12 as that used in S302 (S303) to remove the foreign matters together with the cleaning solution 28. Thereafter, as in the case of the above first to third embodiments, the controller 3 feeds the compressed air 13 from the compressed air pump 7 to the laser cutter 27 and causes the laser cutter 27 to blow the compressed air 13 from the same blowing port 12 as that used in S302 and S303 so as to clean and dry the inside of the through hole 14 as illustrated in FIG. 27 (S304). After completion of the above operation, the controller 3 controls the drive section 4 to remove the laser cutter 27 from the through hole 14 and ends this flow (S305).

Fifth Embodiment

In the above first to fourth embodiments, the plating layer to be subjected to the cutting process is a finally obtained plating layer. A process of forming the plating layer onto the wall of the through hole is roughly divided into two steps: an electroless plating step, and an electrolytic plating step following the electroless plating step. In the fifth embodiment, the cutting process (dividing process) described in the above embodiments is carried out after the electroless plating step and then the electrolytic plating step of applying electrolytic plating to the surface of the electroless plating layer, whereby a printed circuit board having a through hole electrically isolates the front surface of the printed circuit board from the rear surface thereof is fabricated.

FIGS. 28 to 31 are views for explaining formation of the electroless plating layer on the through hole according to the fifth embodiment.

Figure 28:
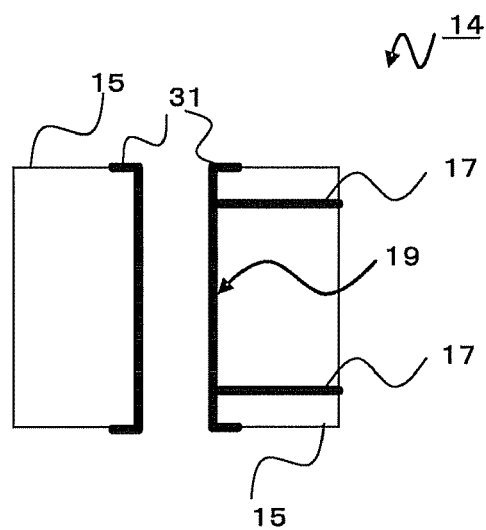
FIG. 28 is a view for explaining formation of an electroless plating layer in a fifth embodiment.
Figure 29:
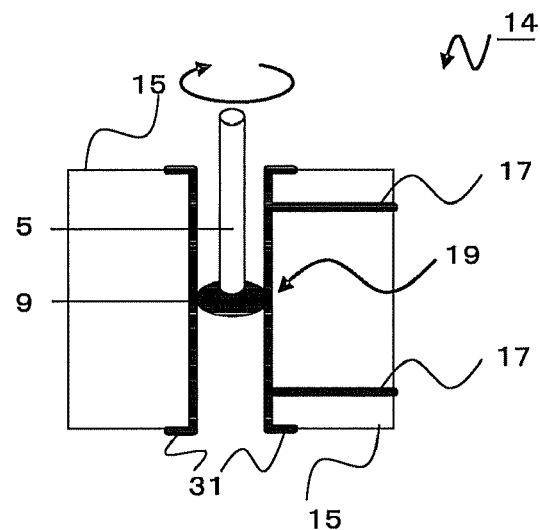
FIG. 29 is a view for explaining cutting of the electroless plating layer in the fifth embodiment.
Figure 30:
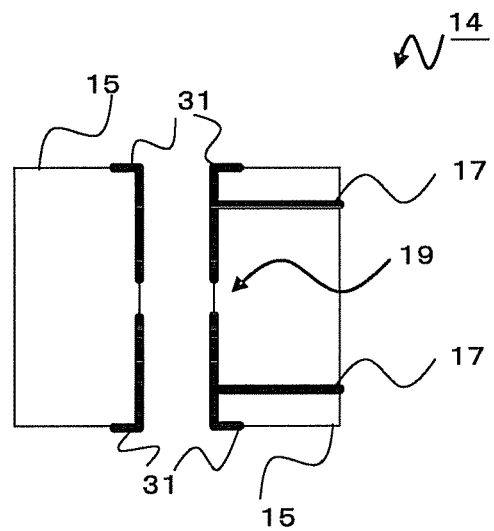
FIG. 30 is a view for explaining a state after the cutting of the electroless plating layer in the fifth embodiment.

As illustrated in FIG. 28, a not illustrated plating machine applies electroless plating to the inner wall of the through hole 14 to form an electroless plating layer 31. Then, after the formation of the electroless plating layer 31, the controller 3 controls the drive section 4, laser oscillator 6, and laser cutter 5 to circularly cut the dividing portion 19 as illustrated in FIG. 29 to form a divided portion as illustrated in FIG. 30 inside the through hole 14. For this processing, one of the processing procedures of the first to fourth embodiments is employed.

Figure 31:
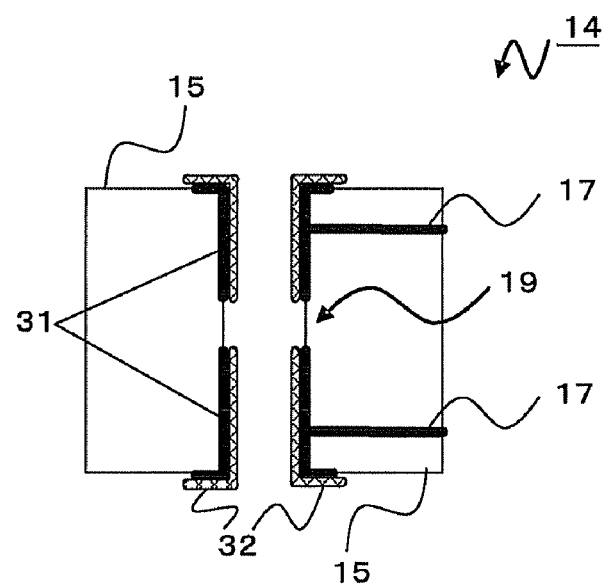
FIG. 31 is a view for explaining formation of an electrolytic plating layer in the fifth embodiment.

Then, as illustrated in FIG. 31, the not illustrated plating machine applies electrolytic plating onto the electroless plating layer 31 to form an electrolytic plating layer 32. Since the portion at which the electroless plating layer 31 has been cut may not be an electrode, the electrolytic plating layer 32 is not formed at the cut portion.

According to the present embodiment, the controller performs the cutting of the dividing portion after the formation of the electroless plating layer, so that it is possible to reduce the output power of the laser oscillator because the mechanical strength of the electroless plating layer is lower than that of the electrolytic plating layer. Further, it is possible to reduce the amount of a high-priced material to be used, such as gold, resulting in a reduction of cost involved in performing the electrolytic plating.

Sixth Embodiment

In a sixth embodiment of the present invention, a case where a plurality of dividing portions are formed in one through hole will be described.

Figure 32:
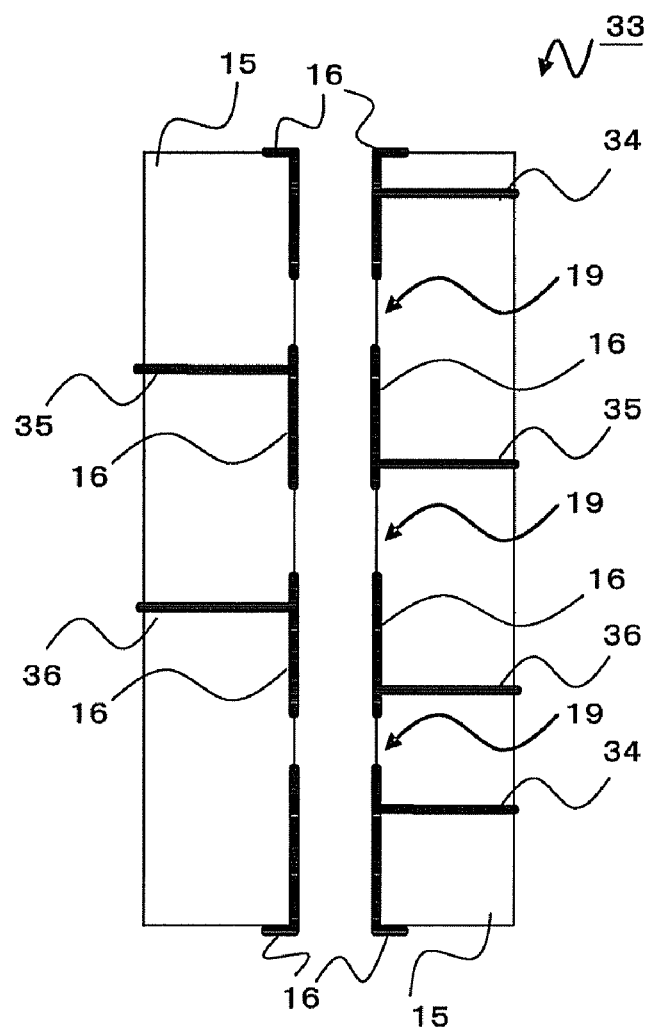
FIG. 32 is a view for explaining a through hole according to a sixth embodiment having a plurality of dividing portions.

FIG. 32 is a view for explaining a through hole according to the sixth embodiment having a plurality of dividing portions.

As illustrated in FIG. 32, a through hole 33 is divided into four segments. Lead wires 34 (lead wires in, e.g., the first and sixth layers) laid in the portions nearest to the front and rear surfaces of the base are connected to external connection terminals through the first and fourth segments of the through hole, lead wires 35 in, e.g., the second and third layers are connected to each other through the second segment of the through hole, and lead wires 36 in, e.g., the fourth and fifth layers are connected to each other through the third segment of the through hole.

According to the sixth embodiment, by forming a plurality of dividing portions in the through hole, it is possible to increase the wiring occupancy ratio in the printed circuit board.

Seventh Embodiment

In a seventh embodiment of the present invention, a case where the cutting process is carried out by means of combination of normal laser emission and rotation of a mirror will be described in comparison with the first embodiment.

That is, in the seventh Embodiment, the controller uses a mirror inserted into the through hole to reflect the laser emitted, in the direction from one of the front and rear surfaces of the printed circuit board, toward the inside of the through hole electrically connecting the front and rear surfaces of the printed circuit board to thereby circularly cut the plating layer. In this case, the mirror having a planar form inclined at a predetermined angle with respect to the laser incident light is rotated in a plane parallel to the printed circuit board.

Figure 33:
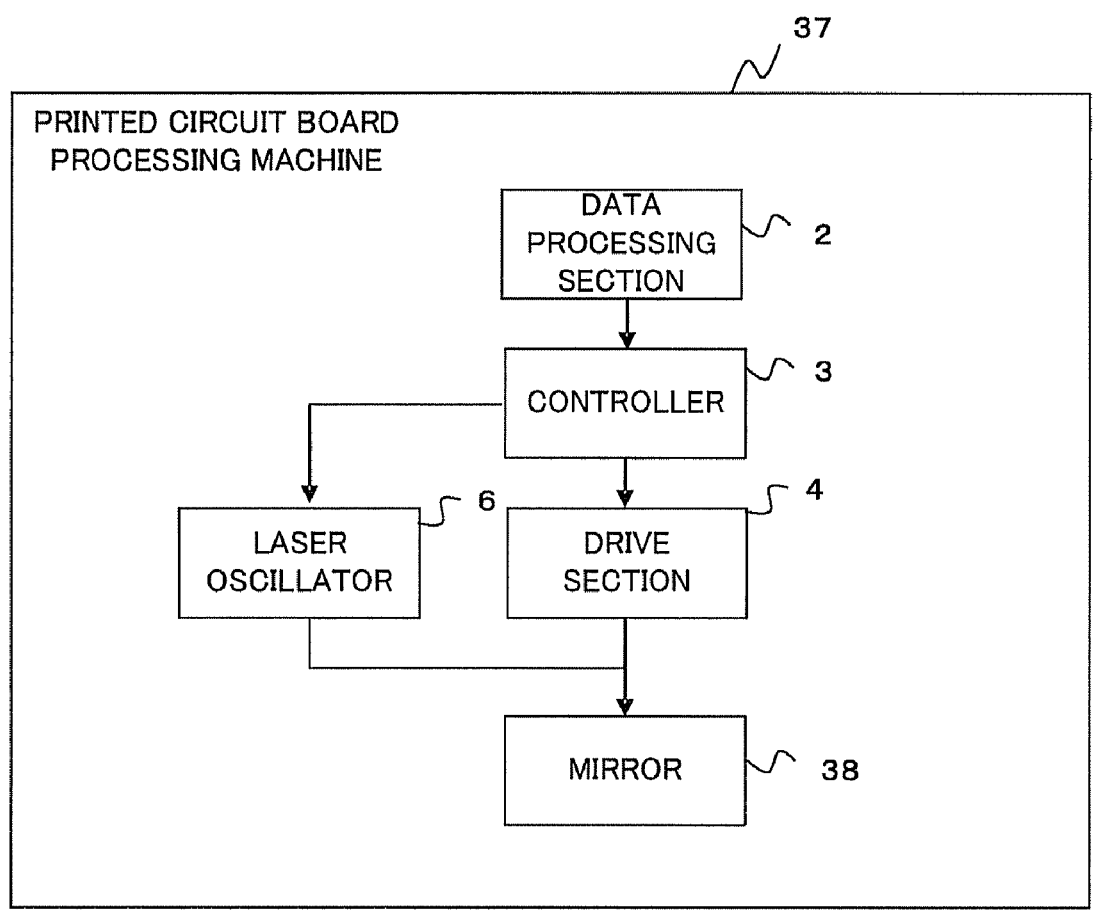
FIG. 33 is a block diagram illustrating an example of a configuration of a printed circuit board processing machine according to a seventh embodiment.

FIG. 33 is a block diagram illustrating an example of a configuration of a printed circuit board processing machine according to the seventh embodiment. A difference between the printed circuit board processing machines of FIG. 1 and a printed circuit board processing machine 37 of FIG. 33 is that the processing machine 37 newly includes a mirror 38 but does not include the laser cutter 5.

The laser oscillator 6 emits the laser 9, and the mirror 38 has a planar form inclined at about 45° with respect to the incident angle of laser 9 and reflects the laser 9 that enters the mirror in parallel with the axis of the through hole 14 at substantially right angles.

An outline of operation of the printed circuit board processing machine according to the present embodiment will next be described.

Figure 34:
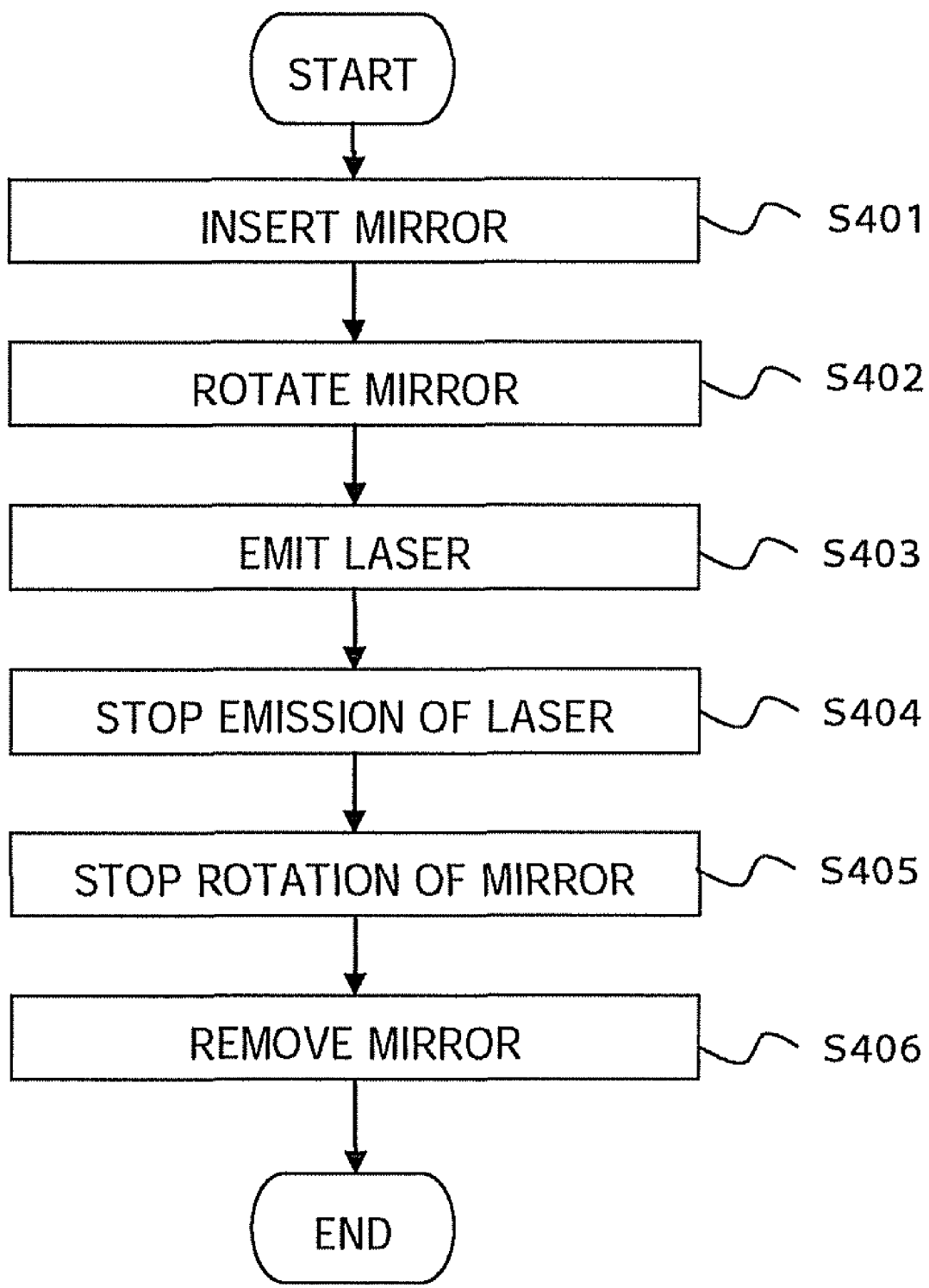
FIG. 34 is a flowchart illustrating an example of a cutting process by means of the laser reflection by the mirror surface according to the seventh embodiment.
Figure 35:
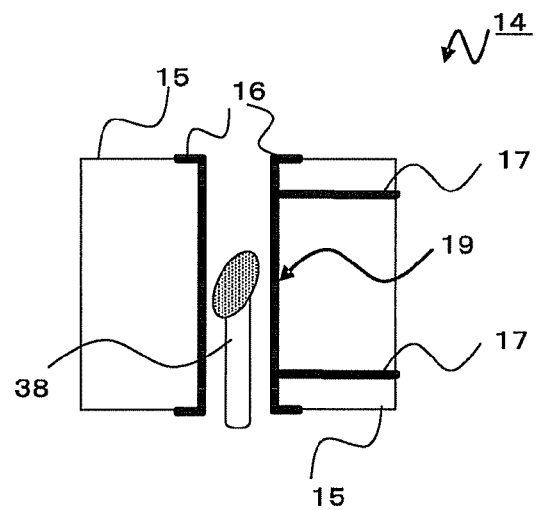
FIG. 35 is a view for explaining insertion of the mirror in the seventh embodiment.
Figure 36:
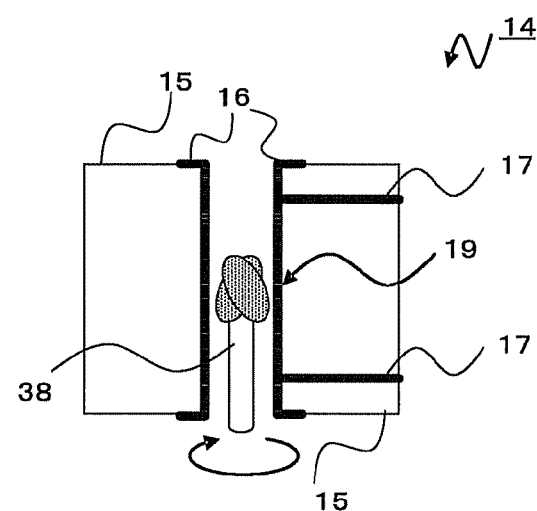
FIG. 36 is a view for explaining rotation of the mirror in the seventh embodiment.

FIG. 34 is a flowchart illustrating an example of a cutting process by means of the laser reflection by the mirror surface according to the seventh embodiment, and FIGS. 35 and 36 are views for explaining respective steps of the cutting process.

As illustrated in FIG. 35, the mirror 38 is inserted into the through hole 14 (S401). That is, after setting the dividing position, the controller 3 controls the drive section 4 to drive the mirror 38 to cause the mirror 38 to be inserted into the through hole 14 until the mirror 38 reaches the set dividing position (S401). In this case, the mirror 38 is inserted into the through hole 14 in the direction opposite to the incident direction of the laser 9.

Figure 37:
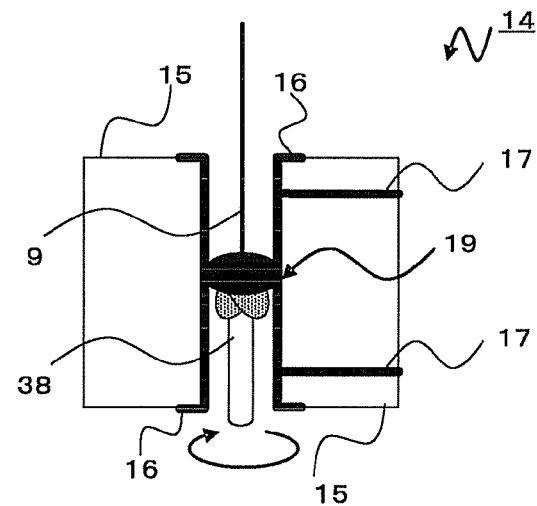
FIG. 37 is a view for explaining emission of the laser in the seventh embodiment.

Then, as illustrated in FIG. 36, after the insertion of the mirror 38, the controller 3 controls the drive section 4 to rotate the mirror 38 (S402). Subsequently, as illustrated in FIG. 37, during rotation of the mirror 38, the controller 3 controls the laser oscillator 6 to emit the laser 9 toward the inside of the through hole 14. The laser 9 is then reflected by the rotating mirror 38, and is irradiated onto the inner wall of the though hole 14 at the set diving position, whereby the dividing portion 19 is circularly cut (S403). The mirror 38 according to the present embodiment has a planar form inclined at about 45° with respect to the plain surface of the printed circuit board. As a result, the laser 9 emitted from above the through hole 14 is reflected by the mirror 38 at substantially 90° and is irradiated onto the inner wall surface of the through hole 14.

Figure 38:
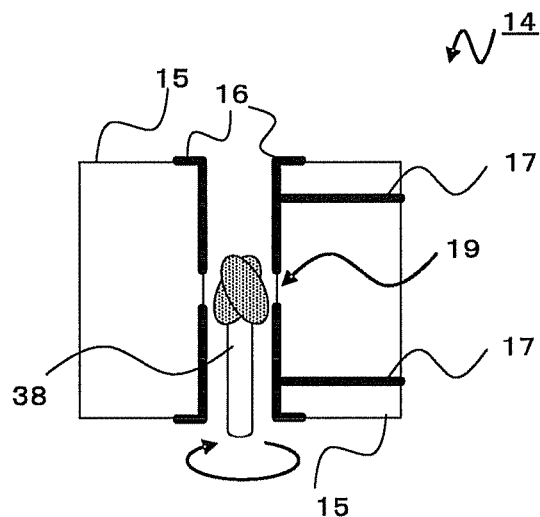
FIG. 38 is a view for explaining stop of the laser emission in the seventh embodiment.
Figure 39:
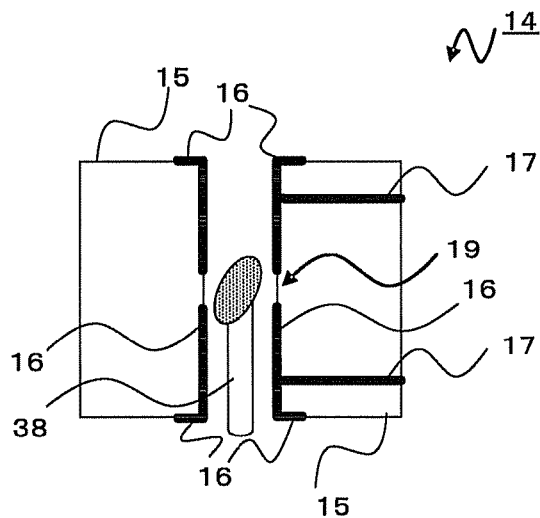
FIG. 39 is a view for explaining stop of the mirror rotation in the seventh embodiment.
Figure 40:
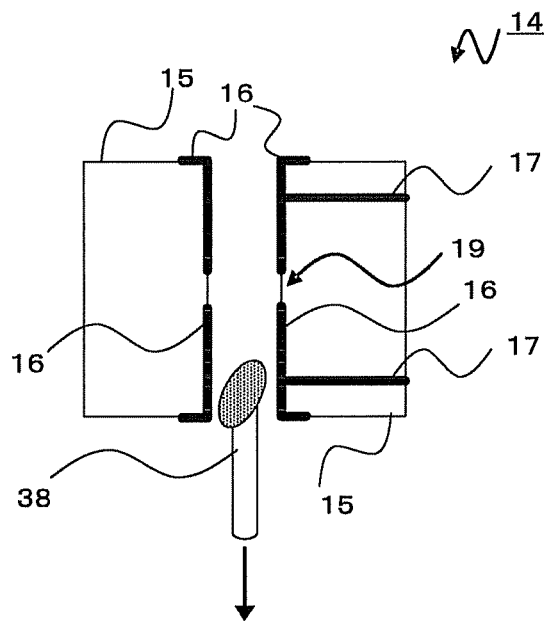
FIG. 40 is a view for explaining removal of the mirror in the seventh embodiment.

After completion of the cutting process, the controller 3 controls the laser oscillator 6 to stop emission of the laser 9 as illustrated in FIG. 38 (S404). Then, as illustrated in FIG. 39, the controller 3 controls the drive section 4 to stop the rotation of the mirror 38 (S405). After the stop of the rotation of the mirror 38, the controller 3 controls the drive section 4 to remove the mirror 38 from the through hole 14 as illustrated in FIG. 40 (S406).

According to the present embodiment, the controller controls the drive section to rotate the mirror to thereby allow the laser to be reflected by the mirror for the cutting process. Thus, the cutting process can be done with a normal laser apparatus, thereby reducing investment in facilities.

Eighth Embodiment

In an eighth embodiment of the present invention, a curved mirror is used in place of the rotating mirror employed in the seventh embodiment to carry out the cutting process.

A mirror according to the eighth embodiment has a curved surface. The laser emitted, in the direction from one of the front and rear surfaces of the printed circuit board, toward the inside of the through hole electrically connecting the front and rear surfaces of the printed circuit board is reflected by the curved surface of the mirror, whereby the plating layer is circularly cut.

Figure 41:
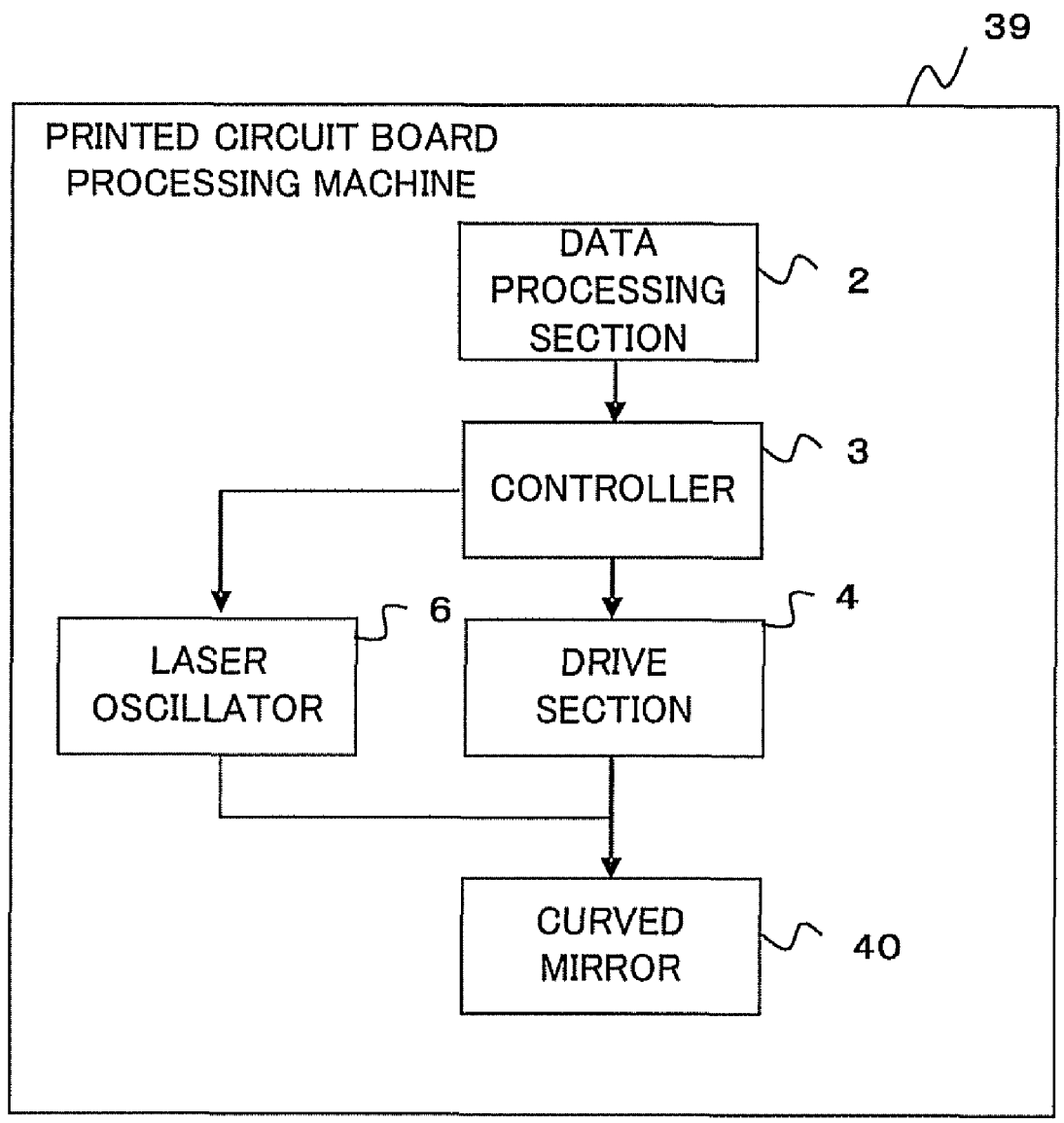
FIG. 41 is a block diagram illustrating an example of a configuration of a printed circuit board processing machine according to an eighth embodiment.

FIG. 41 is a block diagram illustrating an example of a configuration of a printed circuit board processing machine according to the eighth embodiment. A difference between the printed circuit board processing machines 1 of FIG. 1 and a printed circuit board processing machine 39 of FIG. 41 is that the processing machine 39 newly includes a curved mirror 40 but does not include the laser cutter 5. The curved mirror 40 reflects the laser 9.

An outline of operation of the printed circuit board processing machine according to the present embodiment will next be described.

Figure 42:
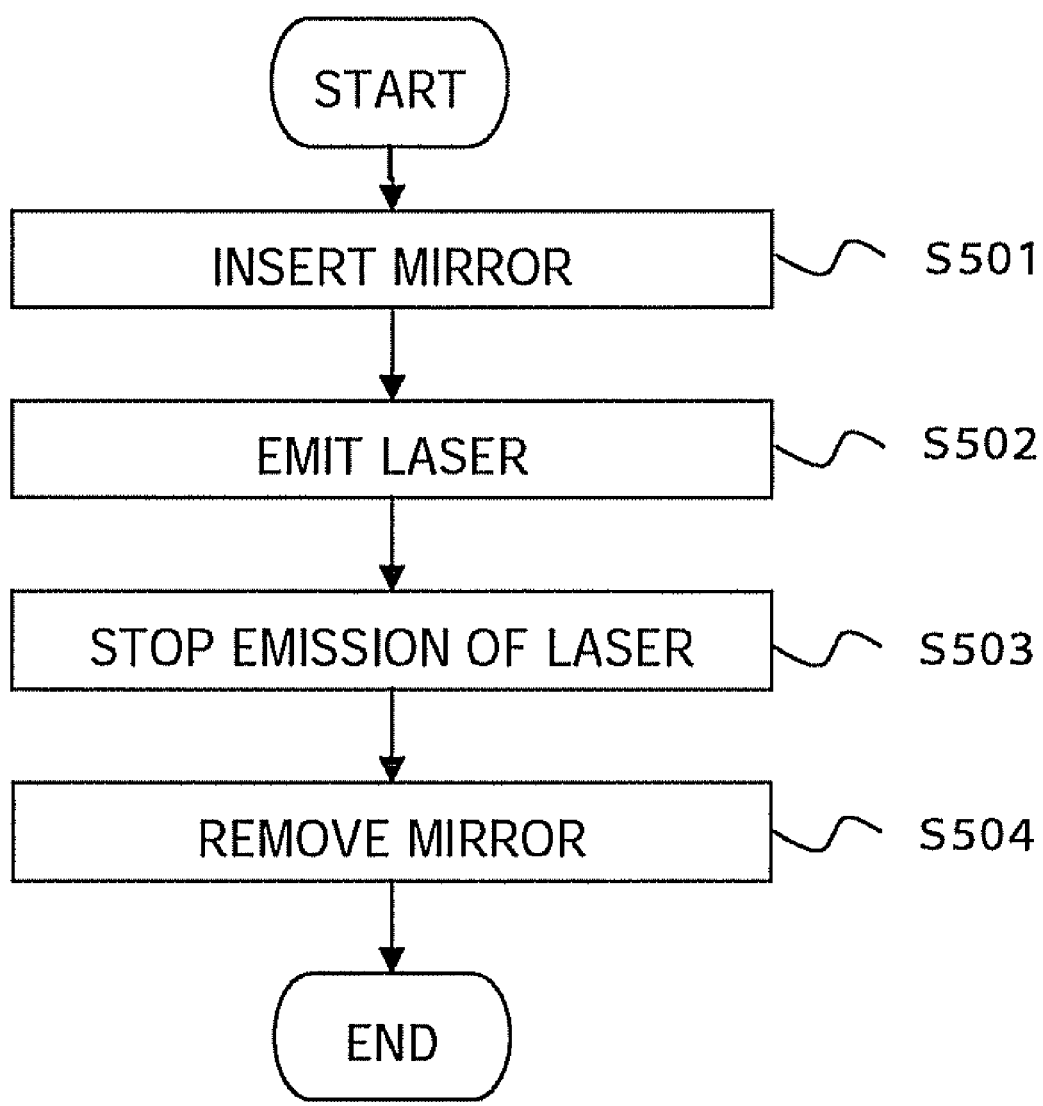
FIG. 42 is a flowchart illustrating an example of a cutting process by means of the laser reflection by the mirror surface according to the eighth embodiment.

FIG. 42 is a flowchart illustrating an example of a cutting process by means of the laser reflection by the mirror surface according to the eighth embodiment, and FIGS. 43 to 46 are views for explaining respective steps of the cutting process.

Figure 43:
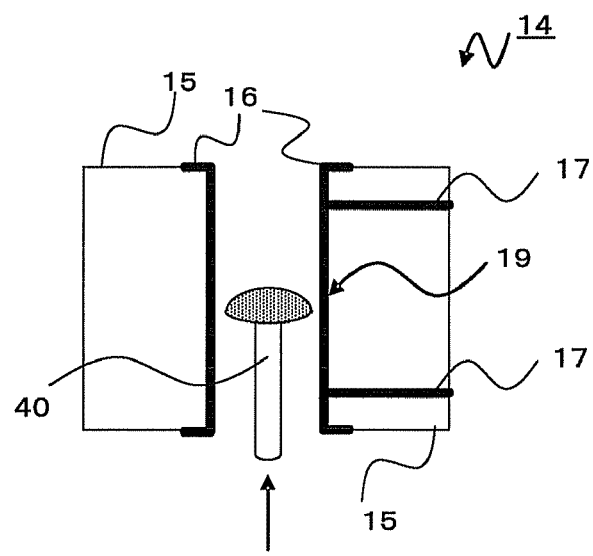
FIG. 43 is a view for explaining insertion of the mirror in the eighth embodiment.

As illustrated in FIG. 43, after setting the dividing position, the controller 3 controls the drive section 4 to drive the curved mirror 40 to cause the curved mirror 40 to be inserted into the through hole 14 until the curved mirror 40 reaches the set dividing position (S501).

Figure 44:
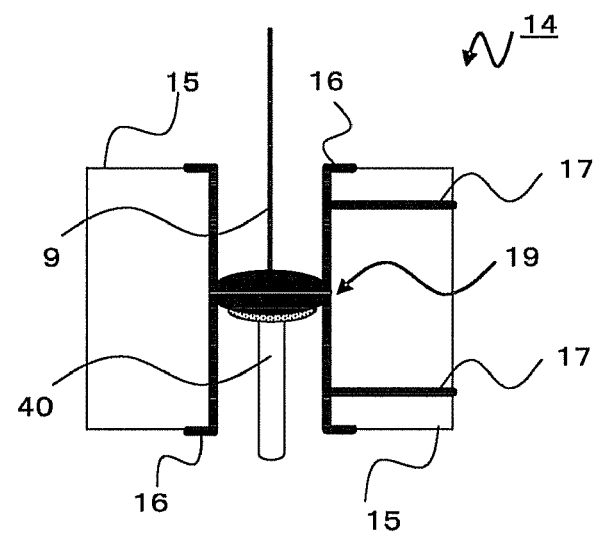
FIG. 44 is a view for explaining emission of the laser in the eighth embodiment.

Then, as illustrated in FIG. 44, after the insertion of the curved mirror 40, the controller 3 controls the laser oscillator 6 to emit the laser 9 toward the inside of the through hole 14. The laser 9 is then radially reflected by the curved mirror 40, and the radially reflected laser 9 is irradiated onto the inner wall of the through hole 14 at the set dividing position as illustrated in FIG. 44, whereby the dividing portion 19 is circularly cut (S502).

Figure 45:
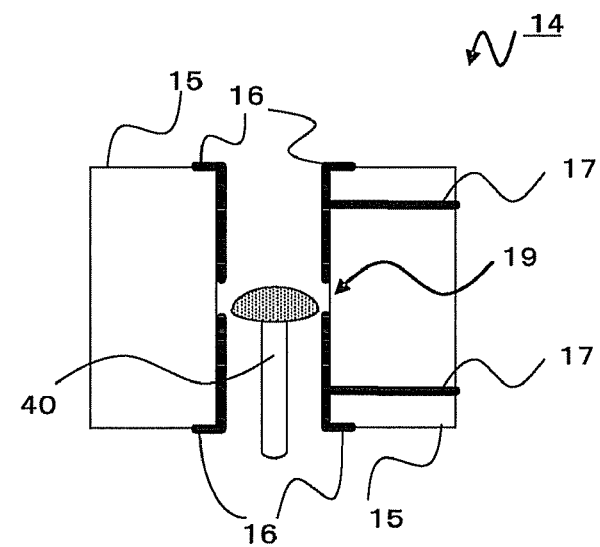
FIG. 45 is a view for explaining stop of the laser emission in the eighth embodiment.
Figure 46:
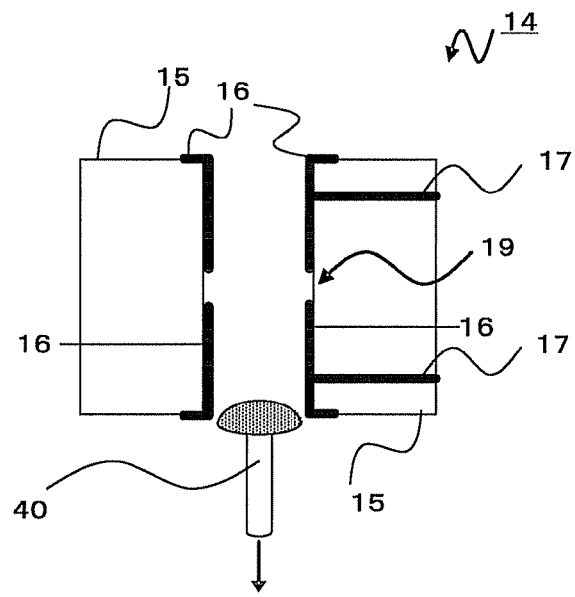
FIG. 46 is a view for explaining removal of the mirror in the eighth embodiment.

Subsequently, after completion of the cutting process, the controller 3 controls the laser oscillator 6 to stop emission of the laser 9 as illustrated in FIG. 45 (S503). Then, after the stop of the laser emission, the controller 3 controls the drive section 4 to remove the curved mirror 40 from the through hole 14 as illustrated in FIG. 46 (S506).

According to the present embodiment, the controller controls the laser oscillator to emit the laser and causes the laser to be radially reflected by the curved mirror for circularly cutting the dividing portion. Thus, the cutting process can be done with a normal laser apparatus and the rotation mechanism of the drive section can be omitted, resulting in a reduction of investment in facilities and simplification of the cutting process.

Ninth Embodiment

In the above embodiments, the laser is used to carry out the cutting process. In the ninth embodiment, however, a drill is used to carry out the cutting process.

Figure 47:
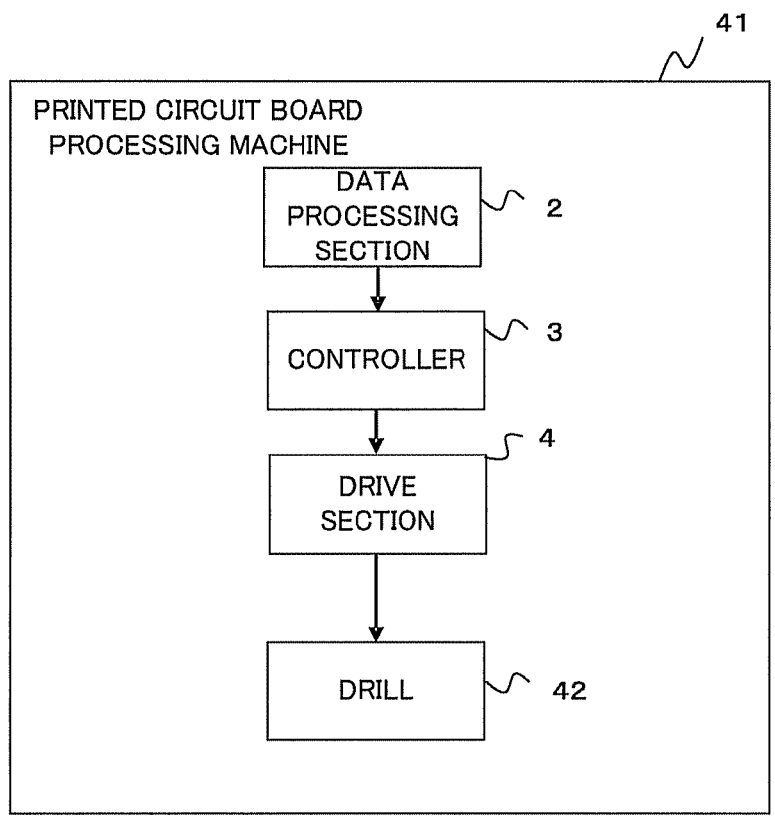
FIG. 47 is a block diagram illustrating an example of a configuration of a printed circuit board processing machine according to a ninth embodiment.

FIG. 47 is a block diagram illustrating an example of a configuration of a printed circuit board processing machine according to the ninth embodiment. A difference between the printed circuit board processing machines 1 of FIG. 1 and a printed circuit board processing machine 41 of FIG. 47 is that the processing machine 47 includes a drill 42 in place of the laser cutter 5. The drill 42 has one end formed in a reverse cone shape and a blade for cutting is fit to the distal end of the cone. The drill 42 may be formed into any shape as long as it can cut the inner wall of the through hole.

An outline of operation of the printed circuit board processing machine according to the present embodiment will next be described.

Figure 48:
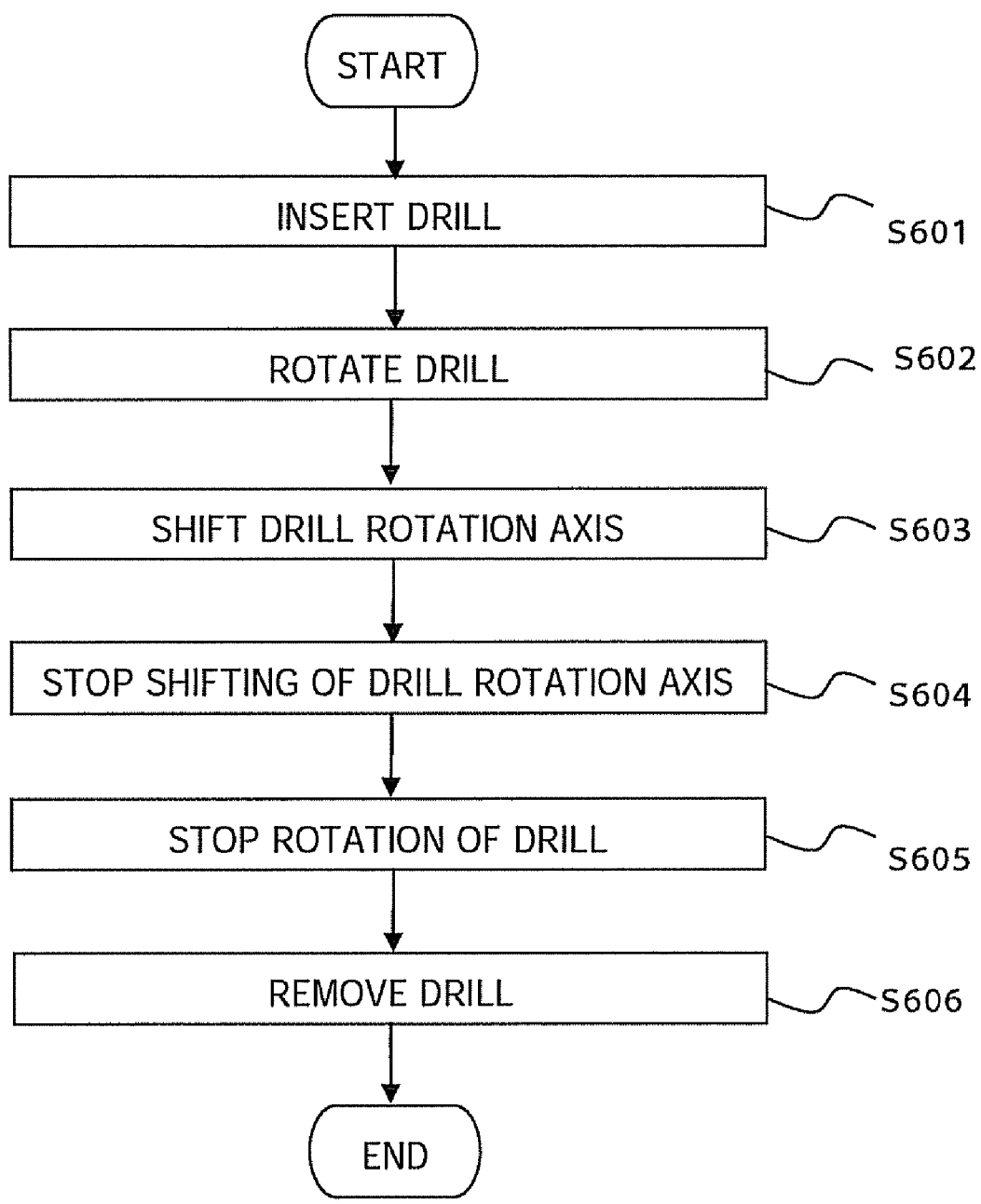
FIG. 48 is a flowchart illustrating an example of a cutting process by means of a drill according to the ninth embodiment.

FIG. 48 is a flowchart illustrating an example of a cutting process by means of the drill according to the ninth embodiment, and FIGS. 49 to 54 are views for explaining respective steps of the cutting process.

Figure 49:
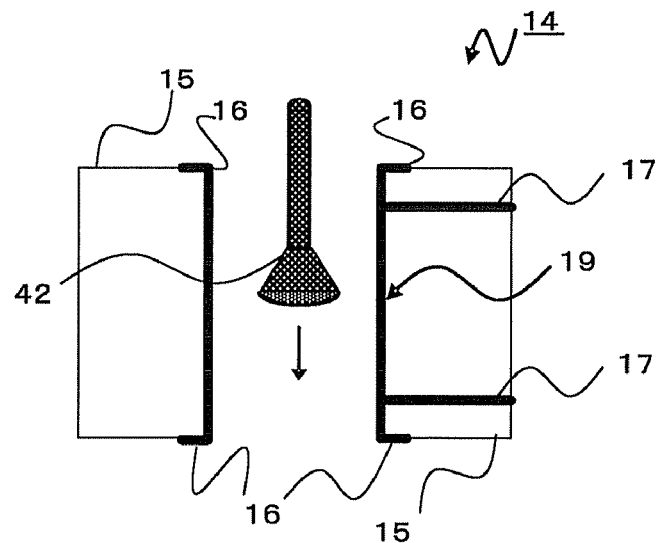
FIG. 49 is a view for explaining insertion of the drill in the ninth embodiment.
Figure 50:
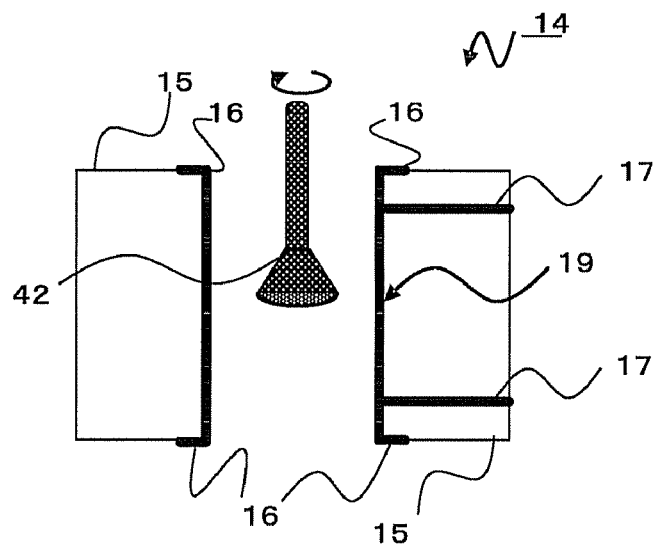
FIG. 50 is a view for explaining rotation of the drill in the ninth embodiment.

As illustrated in FIG. 49, after setting the dividing position, the controller 3 controls the drive section 4 to drive the drill 42 to cause the drill 42 to be inserted into the through hole 14 until the drill 42 reaches the set dividing position (S601). After the insertion of the drill 42, the controller 3 controls the drive section 4 to rotate the drill 42 as illustrated in FIG. 50 (S602).

Figure 51:
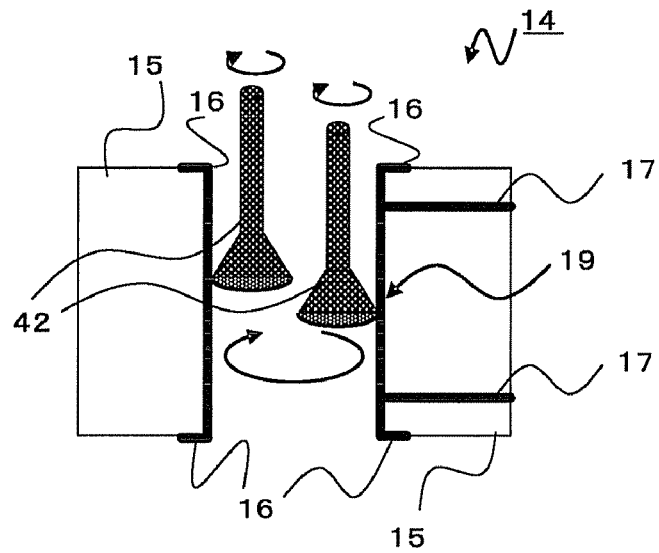
FIG. 51 is a view for explaining shifting of the drill rotation axis in the ninth embodiment.

Then, during the rotation of the drill 42, the controller 3 controls the drive section 4 to sequentially shift the rotation axis of the drill 42 to cause the drill 42 to circularly cut the dividing portion 19 as illustrated in FIG. 51 (S603). That is, the drill 42 circularly cuts the inner wall surface of the through hole 14 with the center axis thereof being rotated. The data processing section 2 previously acquires a value for the cutting blade of the drill 42 to contact the inner wall surface of the through hole 14 as the rotation radius about the center axis of the drill 42 and inputs the value to the controller 3.

Figure 52:
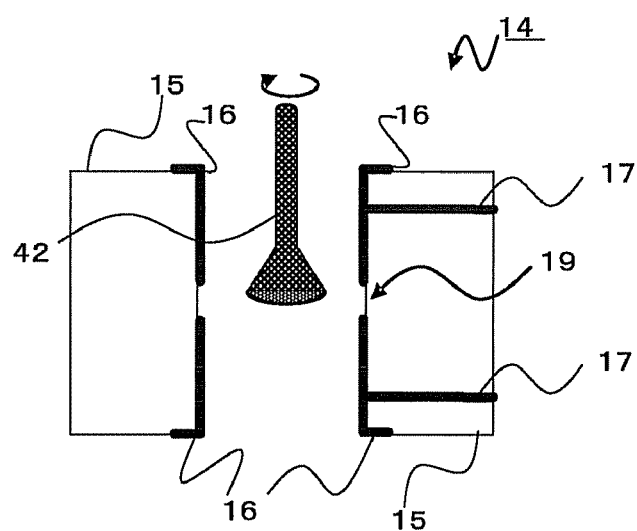
FIG. 52 is a view for explaining stop of the shifting of the drill rotation axis in the ninth embodiment.
Figure 53:
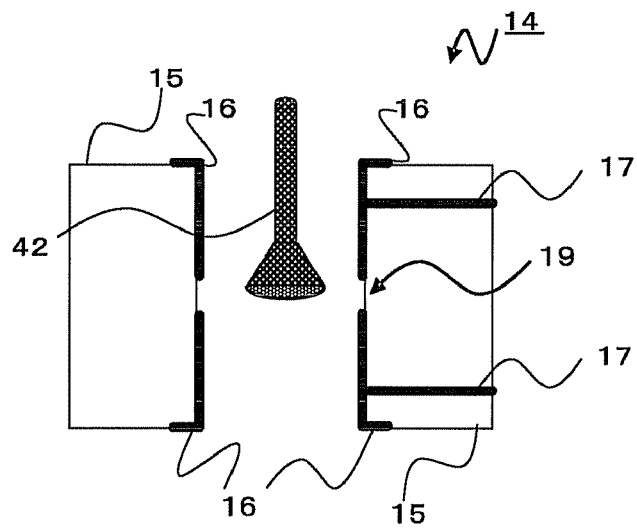
FIG. 53 is a view for explaining stop of the drill rotation in the ninth embodiment.

Then, after the cutting, the controller 3 controls the drive section 4 to stop the shifting of the rotation axis of the drill 42 as illustrated in FIG. 52 (S604). Thereafter, as illustrated in FIG. 53, the controller 3 controls the drive section 4 to stop the rotation of the drill 42 (S605).

Figure 54:
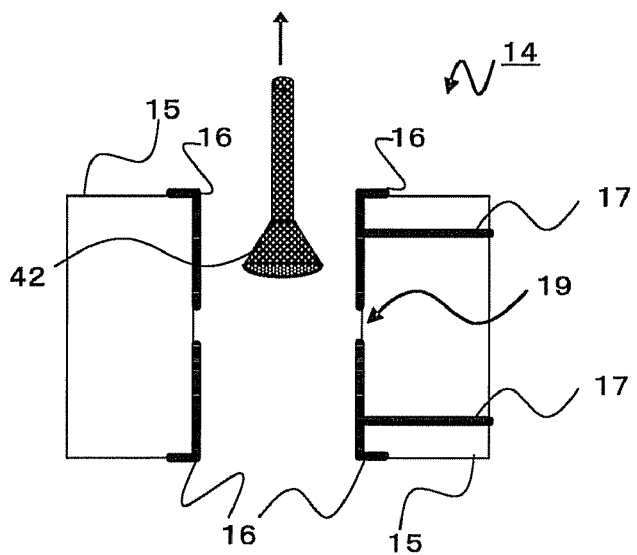
FIG. 54 is a view for explaining removal of the drill in the ninth embodiment.

After the stop of the rotation of the drill 42, the controller 3 controls the drive section 4 to remove the drill 42 from the through hole 14 as illustrated in FIG. 54 (S606).

According to the present embodiment, by using the drill in place of the laser cutter, it is possible to reduce investment in facilities.

Tenth Embodiment

The present embodiment differs from the first embodiment in the formation process of the dividing portion of the electrode. That is, in the tenth embodiment, a non-plating layer made of a material that repels plating solution is provided in the printed circuit board. The plating solution is applied onto the inner wall surface of a hole which is so provided in the printed circuit board as to penetrate through the front and rear surfaces of the printed circuit board, followed by application of electroless plating to the portions other than the non-plating layer. After that, electrolytic plating is applied to the portions to which the electroless plating has been applied and thereby a printed circuit board having a through hole electrically isolates the front surface of the printed circuit board from the rear surface thereof is obtained.

In the electroless plating process, plating solution for causing a chemical reaction is applied to the portion to be plated. When a material that repels the plating solution is formed as a layer in the printed circuit board, an electroless plating layer is not formed in the layer portion. Therefore, a plating layer is not formed in the subsequent electrolytic plating process and thereby the divided structure can be obtained. The material that repels the plating solution can be obtained by mixing wax into a printed circuit board material.

Figure 55:
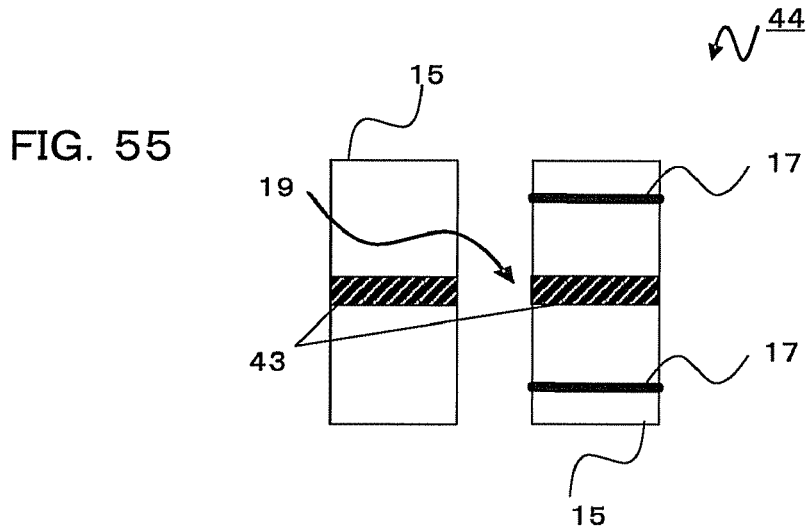
FIG. 55 is a view for explaining formation of a hole in a base of the printed circuit board in which a material that repels plating solution is formed as a layer in the ninth embodiment.

FIG. 55 is a view for explaining formation of a hole in a base of the printed circuit board in which the material that repels the plating solution is formed as a layer, which is a first process in the ninth embodiment. In FIG. 55, the material 43 that repels the plating solution are formed as a layer.

As illustrated in FIG. 55, the through hole 44 has a configuration in which the material 43 that repels the plating solution are sandwiched by a normal base 15. The material 43 is formed as a layer at the dividing portion 19 that has previously been determined as the dividing position.

Figure 56:
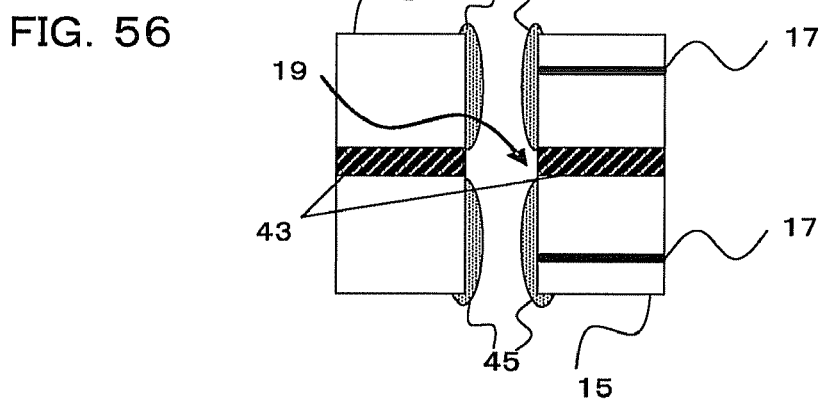
FIG. 56 is a view for explaining application of the plating solution in the ninth embodiment.

FIG. 56 is a view for explaining application of the plating solution, which is a second process in the ninth embodiment. As illustrated in FIG. 56, plating solution 45 is applied to the inner wall surface of the through hole 44 except for the portion corresponding to the material 43. The plating solution 45 is solution for causing a chemical reaction for forming an electroless plating layer in the through hole 44.

Figure 57:
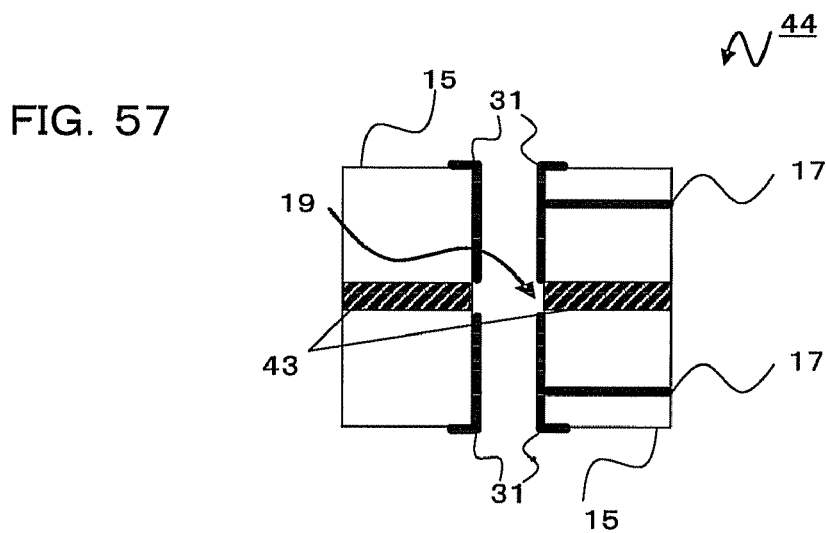
FIG. 57 is a view for explaining formation of an electroless plating layer in the ninth embodiment.

FIG. 57 is a view for explaining formation of the electroless plating layer, which is a third process in the ninth embodiment. As illustrated in FIG. 57, a not illustrated plating machine forms the electroless plating layer 31 in the through hole 44.

Figure 58:
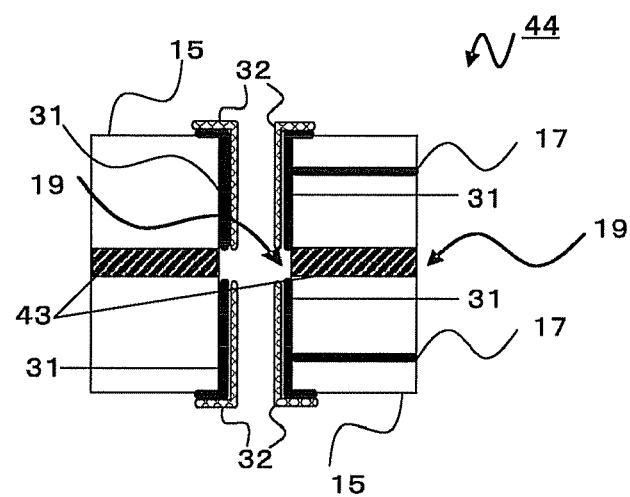
FIG. 58 is a view for explaining formation of an electrolytic plating layer in the ninth embodiment.
Figure 59:
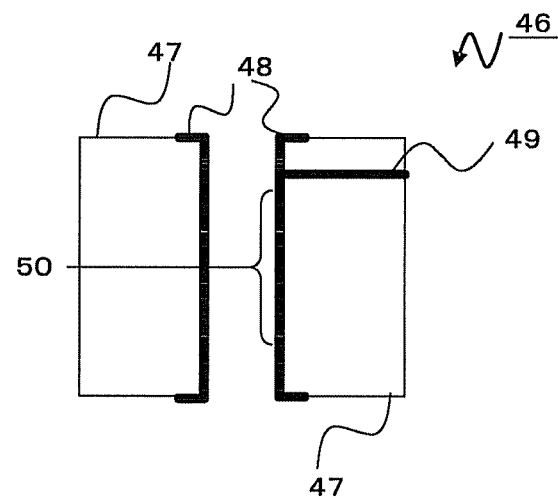
FIG. 59 is a cross-sectional view of the inside of a through hole before application of back drilling.

FIG. 58 is a view for explaining formation of the electrolytic plating layer, which is a forth process in the ninth embodiment. After the formation of the electroless plating layer, a not illustrated plating machine forms the electrolytic plating layer 32 in the through hole 44 as illustrated in FIG. 58.

According to the present embodiment, by forming a material that repels the plating solution as a layer at the dividing portion, it is possible to obtain the divided structure without using special equipment, resulting in a reduction of investment in facilities and simplification of the cutting process.

The dividing process of the T-branch may be performed by appropriately combining the first to ninth embodiments described above.

The present invention can be embodied in various forms, without departing from the spirit or the main feature. Therefore, the aforementioned embodiments are merely illustrative of the invention in every aspect, and not limitative of the same. The scope of the present invention is defined by the appended claims, and is not restricted by the description herein set forth. Further, various changes and modifications to be made within the scope of the appended claims and equivalents thereof are to fall within the scope of the present invention.

As described above, according to the present invention, it is possible to provide a printed circuit board fabrication method capable of improving mounting efficiency and moisture absorption characteristics without sacrificing high-frequency characteristics, a printed circuit board fabricated by the fabrication method, and a printed circuit board fabrication apparatus.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A fabrication method of a printed circuit board including a through hole constituted by a hole penetrating through front and rear surfaces of the printed circuit board, the fabrication method comprising:

applying conductive material plating to an inner wall surface of the hole to form the through hole electrically connecting the front and rear surfaces of the printed circuit board; and removing the conductive material plated on the inner wall surface of the hole, at least at a portion between the front and rear surfaces of the printed circuit board, the removing is carried out to thereby fabricate a printed circuit board having the through hole which electrically isolates the front surface of the printed circuit board from the rear surface thereof, wherein the printed circuit board has a structure having a plurality of wiring layers laminated, and has a first line and a second line which are connected with the conductive material and which are provided in the plurality of wiring layers so that a wiring layer which includes the first line differs from a wiring layer which includes the second line, wherein the removing removes the conductive material between the first line and the second line, and wherein either of the first line and the second line is a third line which is provided in a high-speed signal wiring layer and the other is a fourth line which is provided in a low-speed signal wiring layer, the removing removes the conductive material so that a length of the conductive material from a contact of the third line conductive material to a circularly removed portion is shorter than a length of the conductive material from a contact of the fourth line with the conductive material to the circularly removed portion.

2. The fabrication method according to claim 1, wherein in the removing, a laser is circularly irradiated onto a part of the inner wall surface of the through hole electrically connecting the front and rear surfaces of the printed circuit board to circularly remove the conductive material.

3. The fabrication method according to claim 2, wherein in the removing, a laser emission port is inserted into the through hole electrically connecting the front and rear surfaces of the printed circuit board in a direction from one of the front and rear surfaces of the printed circuit board and is rotated in a plane parallel to the printed circuit board to thereby circularly remove the conductive material.

4. The fabrication method according to claim 2, wherein in the removing, a laser emitted toward an inside of the through hole electrically connecting the front and rear surfaces of the printed circuit board in the direction from one of the front and rear surfaces of the printed circuit board is reflected by a mirror inserted into the through hole to thereby circularly remove the conductive material.

5. The fabrication method according to claim 4, wherein the mirror has a planar form inclined at a predetermined angle with respect to an incident angle of the laser, and the mirror is rotated in a plane parallel to the printed circuit board to thereby circularly remove the conductive material.

6. The fabrication method according to claim 4, wherein the mirror has a curved form, and
the laser emitted toward the inside of the through hole electrically connecting the front and rear surfaces of the printed circuit board in the direction from one of the front and rear surfaces of the printed circuit board is reflected by the curved form of the mirror to thereby circularly remove the conductive material.

7. The fabrication method according to claim 4, wherein in the removing, a drill is inserted into the through hole electrically connecting the front and rear surfaces of the printed circuit board and is rotated while a center axis thereof is rotated to thereby circularly remove the conductive material.

8. The fabrication method according to claim 1, wherein in the removing, the conductive material is removed while air is blown to the inner wall surface of the through hole.

9. The fabrication method according to claim 1, wherein after the removing, the inside of the through hole is cleaned by blowing air to the inner wall surface of the through hole.

10. The fabrication method according to claim 9, wherein prior to the air blowing, water or a cleaning solution is blown to the inner wall surface of the through hole to clean the inside of the through hole.

11. The fabrication method according to claim 1, wherein after the removing, a rotation brush is inserted into the through hole and rotated to clean the inside of the through hole.

12. The fabrication method according to claim 1, wherein
the printed circuit board has the first line and the second line electrically connected by the conductive material, and either of the first line and the second line is electrically connected with a line provided on the front surface of the printed circuit board and the conductive material, and the other of the first line and the second line is electrically connected with a line provided on the rear surface of the printed circuit board and the conductive material, electrically isolating the front surface of the printed circuit board from the rear surface, and
electroless plating is performed in the plating, and
the fabrication method includes applying electrolytic plating to a surface of an electroless plating layer after the removing so as to fabricate a printed circuit board having the through hole.

13. The fabrication method according to claim 1, wherein
design data retains a flag to identify the third line, and
in the removing, the conductive material is cut based on the design data so that a length of the conductive material from a connect of a line associated with the flag connecting with the conductive material to the circularly removed portion is shorter than a length of the conductive material from a connect of a line not associated with the flag connecting with the conductive material to the circularly removed portion.

\* \* \* \* \*

UNITED STATES PATENT AND TRADEMARK OFFICE
CERTIFICATE OF CORRECTION

| | |
|---|---|
| PATENT NO. | : 8,402,648 B2 |
| APPLICATION NO. | : 12/364036 |
| DATED | : March 26, 2013 |
| INVENTOR(S) | : Daita Tsubamoto et al. |

It is certified that error appears in the above-identified patent and that said Letters Patent is hereby corrected as shown below:

Title Page, Column 2 (Other Publications), Line 2, Delete "allready" and insert -- already --, therefor.
Title Page, Column 2 (Other Publications), Line 3, Delete "Recvord"" and insert -- Recovered" --, therefor.

In the Claims
Column 16, Line 31, In Claim 1, delete "line" and insert -- line with the --, therefor.
Column 17, Line 5, In Claim 7, delete "4," and insert -- 1, --, therefor.

Signed and Sealed this
Second Day of July, 2013

Teresa Stanek Rea
*Acting Director of the United States Patent and Trademark Office*